(12) United States Patent
Finn et al.

(10) Patent No.: US 9,251,458 B2
(45) Date of Patent: Feb. 2, 2016

(54) SELECTIVE DEPOSITION OF MAGNETIC PARTICLES AND USING MAGNETIC MATERIAL AS A CARRIER MEDIUM TO DEPOSIT NANOPARTICLES

(71) Applicants: David Finn, Mayo (IE); Mustafa Lotya, Celbridge (IE)

(72) Inventors: David Finn, Mayo (IE); Mustafa Lotya, Celbridge (IE)

(73) Assignee: Féinics AmaTech Teoranta, Lower Churchfield, Tourmakeady, Co. Mayo (IE)

( * ) Notice: Subject to any disclaimer, the term of this patent is extended or adjusted under 35 U.S.C. 154(b) by 0 days.

(21) Appl. No.: 14/225,570

(22) Filed: Mar. 26, 2014

(65) Prior Publication Data

US 2014/0209691 A1 Jul. 31, 2014

Related U.S. Application Data

(63) Continuation-in-part of application No. 14/078,527, filed on Nov. 13, 2013, now Pat. No. 9,112,272, and a continuation-in-part of application No. 14/173,815, filed on Feb. 6, 2014, and a continuation-in-part of (Continued)

(51) Int. Cl.
*G06K 19/07* (2006.01)
*G06K 19/077* (2006.01)
(Continued)

(52) U.S. Cl.
CPC .... *G06K 19/07769* (2013.01); *G06K 19/07794* (2013.01); *H01Q 1/2225* (2013.01); *H01Q 1/2283* (2013.01); *H01Q 1/38* (2013.01); *H01Q 7/00* (2013.01); *H05K 1/0233* (2013.01); *H01F 27/365* (2013.01); *H01F 38/14* (2013.01);
(Continued)

(58) Field of Classification Search
CPC ............... G06K 19/07769; G06K 19/07794; H01Q 1/2225; H01Q 1/2283; H01Q 1/38; H01Q 7/00; H05K 1/0233; H05K 1/183; H05K 3/1275; H05K 2201/0218; H05K 2201/0723; H05K 2201/086; H05K 2201/10098; H01F 38/14; H01F 27/365; H01F 41/16
See application file for complete search history.

(56) References Cited

U.S. PATENT DOCUMENTS 5,610,633 A 3/1997 Eltgen et al.
5,644,987 A 7/1997 Eltgen et al.
(Continued)

FOREIGN PATENT DOCUMENTS

EP 0754985 6/2001
EP 2264645 12/2010
(Continued)

OTHER PUBLICATIONS

Partial European Search Report in 14161893.4, Dec. 4, 2014.

*Primary Examiner* — Kristy A Haupt
(74) *Attorney, Agent, or Firm* — Gerald E. Linden

(57) ABSTRACT

Selective deposition of magnetic material such as particles, and producing a pre-laminated stack of shielding layers for offsetting attenuation of RF caused by a metal face plate of a smart card (or tag) or a metallized layer near a passive transponder. Coated or uncoated magnetic particles of different sizes may be used to increase the packing density of the material after its deposition on a substrate. Magnetography-based techniques may be used to apply the particles, at high packing density, including different-sized particles to a substrate such as PVC. Magnetic particles may be used as a carrier medium to deposit other particles nanoparticles. A system for selective deposition is disclosed.

11 Claims, 16 Drawing Sheets

Related U.S. Application Data application No. 14/020,884, filed on Sep. 8, 2013, now Pat. No. 9,033,250, application No. 14/225,570, which is a continuation-in-part of application No. 13/756,631, filed on Feb. 1, 2013, now Pat. No. 8,870,080, which is a continuation-in-part of application No. 13/594,895, filed on Aug. 27, 2012, now Pat. No. 8,789,762, and a continuation-in-part of application No. 13/294,578, filed on Nov. 11, 2011, now abandoned, and a continuation-in-part of application No. 13/310,718, filed on Dec. 3, 2011, now Pat. No. 8,366,009, application No. 14/225,570, which is a continuation-in-part of application No. 13/744,686, filed on Jan. 18, 2013, now abandoned, application No. 14/225,570, which is a continuation-in-part of application No. 13/294,578, filed on Nov. 11, 2011, now abandoned.

(60) Provisional application No. 61/955,325, filed on Mar. 19, 2014, provisional application No. 61/950,020, filed on Mar. 8, 2014, provisional application No. 61/920,737, filed on Dec. 25, 2013, provisional application No. 61/937,541, filed on Feb. 9, 2014, provisional application No. 61/945,689, filed on Feb. 27, 2014, provisional application No. 61/914,996, filed on Dec. 12, 2013, provisional application No. 61/905,134, filed on Nov. 15, 2013, provisional application No. 61/936,356, filed on Feb. 6, 2014, provisional application No. 61/902,217, filed on Nov. 9, 2013, provisional application No. 61/883,197, filed on Sep. 27, 2013, provisional application No. 61/805,566, filed on Mar. 27, 2013, provisional application No. 61/533,228, filed on Sep. 11, 2011, provisional application No. 61/569,317, filed on Dec. 12, 2011, provisional application No. 61/586,781, filed on Jan. 14, 2012, provisional application No. 61/595,088, filed on Feb. 5, 2012, provisional application No. 61/624,384, filed on Apr. 15, 2012, provisional application No. 61/624,412, filed on Apr. 16, 2012, provisional application No. 61/646,369, filed on May 14, 2012, provisional application No. 61/589,434, filed on Jan. 23, 2012, provisional application No. 61/619,951, filed on Apr. 4, 2012, provisional application No. 61/693,262, filed on Aug. 25, 2012, provisional application No. 61/732,414, filed on Dec. 3, 2012.

(51) Int. Cl.
| | |
|---|---|
| *H01Q 1/22* | (2006.01) |
| *H01Q 1/38* | (2006.01) |
| *H01Q 7/00* | (2006.01) |
| *H05K 1/02* | (2006.01) |
| *H01F 38/14* | (2006.01) |
| *H01F 27/36* | (2006.01) |
| *H01F 41/16* | (2006.01) |
| *H05K 1/18* | (2006.01) |
| *H05K 3/12* | (2006.01) |

(52) U.S. Cl.
CPC ............... *H01F41/16* (2013.01); *H05K 1/183* (2013.01); *H05K 3/1275* (2013.01); *H05K 2201/0218* (2013.01); *H05K 2201/0723* (2013.01); *H05K 2201/086* (2013.01); *H05K 2201/10098* (2013.01)

(56) References Cited

U.S. PATENT DOCUMENTS

| | | |
|---|---|---|
| 5,992,323 A | 11/1999 | Eltgen et al. |
| 6,088,230 A | 7/2000 | Finn et al. |
| 6,120,142 A | 9/2000 | Eltgen et al. |
| 6,233,818 B1 | 5/2001 | Finn et al. |
| 6,329,958 B1 | 12/2001 | McLean et al. |
| 6,345,882 B1 | 2/2002 | Brechat |
| 6,378,774 B1 | 4/2002 | Emori et al. |
| 6,698,089 B2 | 3/2004 | Finn et al. |
| 6,817,085 B2 | 11/2004 | Uchikoba et al. |
| 7,481,884 B2 | 1/2009 | Stelter et al. |
| 7,537,874 B2 | 5/2009 | Mang et al. |
| 7,615,256 B2 | 11/2009 | Rickert et al. |
| 7,799,147 B2 | 9/2010 | Matsukawa et al. |
| 7,922,787 B2 | 4/2011 | Wang et al. |
| 7,948,057 B2 | 5/2011 | Furukawa |
| 8,158,018 B2 | 4/2012 | Nakahata et al. |
| 8,261,997 B2 | 9/2012 | Gebhart |
| 2009/0159657 A1* | 6/2009 | Chen et al. ............ 235/375 |
| 2009/0169776 A1 | 7/2009 | Herslow |
| 2011/0189620 A1 | 8/2011 | Herslow |
| 2012/0055013 A1 | 3/2012 | Finn |
| 2012/0074233 A1 | 3/2012 | Finn et al. |
| 2013/0075477 A1 | 3/2013 | Finn et al. |
| 2013/0126622 A1 | 5/2013 | Finn |
| 2013/0140370 A1 | 6/2013 | Finn |

FOREIGN PATENT DOCUMENTS

| | | |
|---|---|---|
| EP | 1854222 | 6/2012 |
| WO | WO 2012200073 | 2/2012 |

* cited by examiner

Dual Interface (DI) Smart Card, and Readers an exemplary booster antenna (BA)

Stackup of Shielding Layers

Selectively-Deposited Shielding Layer

Large and Small Particles

Coated Particles

Carrier

Conglomerate

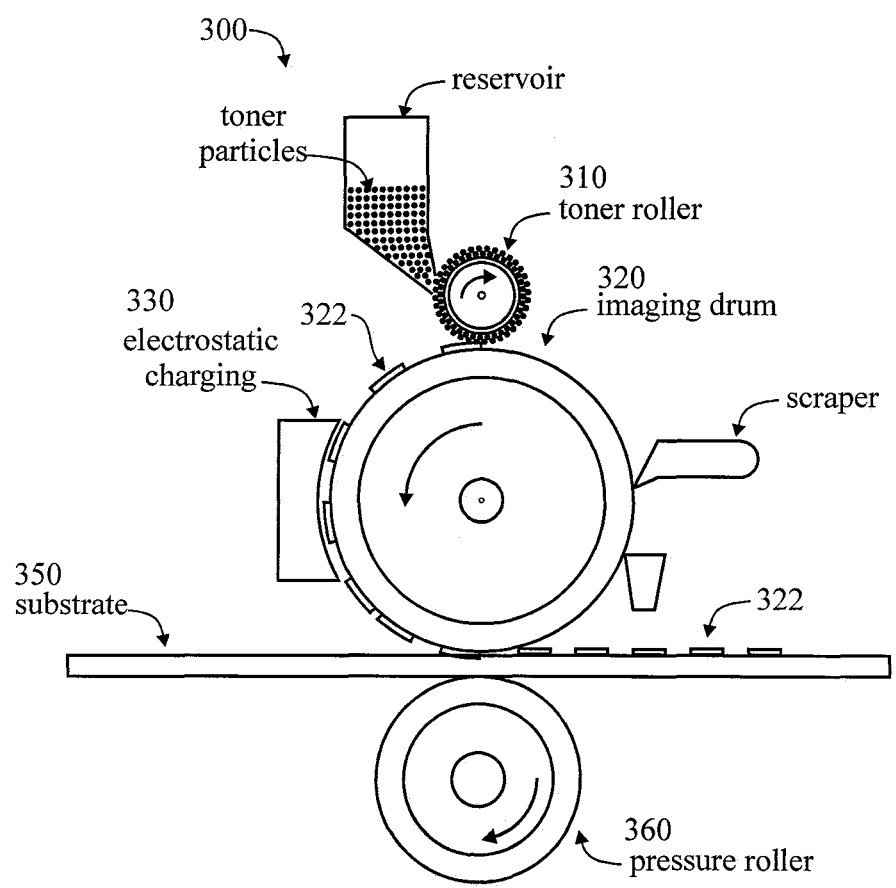

etched antenna additional antenna(s) on contact side connection bridges functional material in gaps between contact pads 1306 tracks
1304 gaps
Laser
substrate 1302

1404 binder
substrate 1402

1404 binder
1406 nanowires
substrate 1402

1404 binder
1408 tracks
Laser
substrate 1402

US 9,251,458 B2

SELECTIVE DEPOSITION OF MAGNETIC PARTICLES AND USING MAGNETIC MATERIAL AS A CARRIER MEDIUM TO DEPOSIT NANOPARTICLES

CROSS-REFERENCES TO RELATED APPLICATIONS

Priority is claimed as a continuation-in-part (CIP) or nonprovisional of the following:
Nonprovisional of U.S. 61955325 filed 19 Mar. 2014
Nonprovisional of U.S. 61950020 filed 8 Mar. 2014
CIP of Ser. No. 14/078,527 filed 13 Nov. 2013
Nonprovisional of 61920737 filed 25 Dec. 2013
Nonprovisional of 61937541 filed 9 Feb. 2014
Nonprovisional of 61945689 filed 27 Feb. 2014
CIP of Ser. No. 14/173,815 filed 6 Feb. 2014, which claims priority from . . .
   U.S. 61914996 filed 12 Dec. 2013
   U.S. 61905134 filed 15 Nov. 2013
   U.S. Ser. No. 14/020,884 filed 8 Sep. 2013
Nonprovisional of U.S. 61936356 filed 6 Feb. 2014
Nonprovisional of U.S. 61902217 filed 9 Nov. 2013
Nonprovisional of U.S. 61883197 filed 27 Sep. 2013
Nonprovisional of U.S. 61805566 filed 27 Mar. 2013
CIP of U.S. Ser. No. 13/756,631 filed 1 Feb. 2013 (20130140370, 06 Jun. 2013), which claims priority from U.S. Ser. No. 13/594,895 filed 27 Aug. 2012 (2013/0062419, 14 Mar. 2013), which claims priority from
   61533228 filed 11 Sep. 2011 by Finn capacitive stubs, ferrite earliest
   Ser. No. 13/294,578 filed 11 Nov. 2011 by Finn (US 2012/0055013 Mar. 8, 2012)
   Ser. No. 13/310,718 filed 3 Dec. 2011 by Finn & Ummenhofer
   61569317 filed 12 Dec. 2011 by Finn
   61586781 filed 14 Jan. 2012 by Finn
   61595088 filed 5 Feb. 2012 by Finn
   61624384 filed 15 Apr. 2012 by Finn
   61624412 filed 16 Apr. 2012 by Finn
   61646369 filed 14 May 2012 by Finn
CIP of U.S. Ser. No. 13/744,686 filed 18 Jan. 2013 (20130126622, 23 May 2013), which claims priority from
   61732414 filed 3 Dec. 2012
   61693262 filed 25 Aug. 2012
   61619951 filed 4 Apr. 2012
   61589434 filed 23 Jan. 2012
CIP of U.S. Ser. No. 13/294578 filed 11 Nov. 2011 (20120055013, 08 Mar. 2012)

TECHNICAL FIELD

Portions of this disclosure may be directed to the selective deposition of magnetic particles on substrates, such as inlay substrates for RFID devices, including secure documents, such as smart cards (generally, credit or debit cards, payment cards, contactless cards, tags), or other secure documents such as national IDs, passports and the like, operating at least in a contactless mode (ISO 14443), and also for or for other "transponder devices" operating in a passive mode, such as keyless entry cards. The disclosure may also disclose techniques for using magnetic material as a carrier medium to deposit other materials, such as nanoparticles, to form conductive elements such as antennas for smart cards.

BACKGROUND

A dual interface (DI or DIF) smart card (or chip card) is an example of an RFID device, which is a type of secure document, and may generally comprise: an antenna module AM, a card body CB, and a booster antenna BA.

The antenna module AM may generally comprise an RFID chip (bare, unpackaged silicon die) or chip module (a die with leadframe, carrier or the like)—either of which may be referred to as "CM"—mounted to a module tape MT. A module antenna MA may be disposed on the module tape MT for implementing a contactless interface. Contact pads CP (typically six or eight contact pads) may be disposed on the module tape MT for implementing the contact interface. The module tape MT may comprise a pattern of interconnects (conductive traces and pads) to which the chip CM and contact pads CP may be connected. The antenna module (AM) may measure approximately 12×13 mm (for an 8-pad module) or approximately 8×11 mm (for a 6-pad module).

The module antenna MA may be connected, indirectly, via some of the interconnects to the chip CM, or may be directly connected to bond pads BP on the chip CM. The module antenna MA may comprise several turns of wire, such as 112 micron diameter insulated wire. Reference may be made to U.S. Pat. No. 6,378,774 (2002, Toppan), for example FIGS. 12A, B thereof.

The card body CB—which may be referred to as a substrate, or an inlay substrate—may generally comprise one or more layers of material such as Polyvinyl Chloride (PVC), Polycarbonate (PC), PET-G (Polyethylene Terephtalate Glycol-modified), Copolyester (Tritan), Teslin™, synthetic paper, paper and the like. When "inlay substrate" is referred to herein, it should be taken to include "card body", and vice versa, as well as any other substrate for a secure document, unless explicitly otherwise stated.

The card body CB may be generally rectangular, measuring approximately 54 mm×86 mm (refer to ISO/IEC 7810), having a thickness of approximately 300 μm thick. The card body CB is typically significantly (such as 20 times) larger than the antenna module AM.

The booster antenna BA may generally comprise a relatively large winding which may be referred to as a card antenna CA component (or portion) having a number of turns disposed in a peripheral area of the card body CB, and a relatively small coupler coil (or coupler antenna) CC component (or portion) having a number of turns disposed at a coupling area of the card body CB corresponding to a location of the antenna module AM, and an extension antenna EA component disposed in an upper portion of the card body CB (avoiding an embossing area in a lower portion of the card body CB). The booster antenna BA (and its various components) may comprise wire mounted to (embedded in) the card body CB using an ultrasonic tool comprising a sonotrode and a capillary. See, for example U.S. Pat. Nos. 6,698,089 and 6,233,818. The wire may be non-insulated, insulated, or self-bonding wire, having an exemplary diameter in the range of approximately 50-112 μm.

Nanowires & Nanotubes

When used herein, references to "nanoparticles" should be taken to include nanowires and nanotubes. Any of these may be referred to as "nanostructures".

A nanowire (NW) is a nanostructure, with the diameter of the order of a nanometer. Alternatively, nanowires can be defined as structures that have a thickness or diameter constrained to tens of nanometers or less and an unconstrained length. At these scales, quantum mechanical effects are important—which coined the term "quantum wires". Many different types of nanowires exist, including metallic (e.g., Ni, Pt, Au), semiconducting (e.g., Si, InP, GaN, etc.), and insulating (e.g., $SiO_2$, $TiO_2$). Molecular nanowires are composed of repeating molecular units and are either organic (e.g.

DNA) or inorganic (e.g. Mo6S9-xIx). Typical nanowires exhibit aspect ratios (length-to-width ratio) of 1000 or more. As such they are often referred to as one-dimensional (1-D) materials. Nanowires have many interesting properties that are not seen in bulk or 3-D materials. This is because electrons in nanowires are quantum confined laterally and thus occupy energy levels that are different from the traditional continuum of energy levels or bands found in bulk materials. The conductivity of a nanowire is expected to be much less than that of the corresponding bulk material. This is due to a variety of reasons. First, there is scattering from the wire boundaries, when the wire width is below the free electron mean free path of the bulk material. In copper, for example, the mean free path is 40 nm. Nanowires less than 40 nm wide will shorten the mean free path to the wire width. Nanowires also show other peculiar electrical properties due to their size. Unlike carbon nanotubes, whose motion of electrons can fall under the regime of ballistic transport (meaning the electrons can travel freely from one electrode to the other), nanowire conductivity is strongly influenced by edge effects. The edge effects come from atoms that lay at the nanowire surface and are not fully bonded to neighboring atoms like the atoms within the bulk of the nanowire. The unbonded atoms are often a source of defects within the nanowire, and may cause the nanowire to conduct electricity more poorly than the bulk material. As a nanowire shrinks in size, the surface atoms become more numerous compared to the atoms within the nanowire, and edge effects become more important.

High frequency (HF) antennas (13.56 MHz) may include a plurality of nanowire heterostructures, such as core memory, inductive coils made of nanowires, antitheft devices based on nanowire structures, creating RFID tags on paper money to offset fraud.

Carbon nanotubes (CNTs) are allotropes of carbon with a cylindrical nanostructure. Nanotubes have been constructed with length-to-diameter ratio of up to 132,000,000:1, significantly larger than for any other material. These cylindrical carbon molecules have unusual properties, which are valuable for nanotechnology, electronics, optics and other fields of materials science and technology. In particular, owing to their extraordinary thermal conductivity and mechanical and electrical properties, carbon nanotubes may find applications as additives to various structural materials.

Nanotubes are members of the fullerene structural family, which also includes spherical buckyballs, and the ends of a nanotube may be capped with a hemisphere of the buckyball structure. Their name is derived from their long, hollow structure with the walls formed by one-atom-thick sheets of carbon, called graphene. These sheets are rolled at specific and discrete ("chiral") angles, and the combination of the rolling angle and radius decides the nanotube properties; for example, whether the individual nanotube shell is a metal or semiconductor. Nanotubes are categorized as single-walled nanotubes (SWNTs) and multi-walled nanotubes (MWNTs). Individual nanotubes naturally align themselves into "ropes" held together by van der Waals forces. Because of the symmetry and unique electronic structure of graphene, the structure of a nanotube strongly affects its electrical properties. For a given (n,m) nanotube, if n=m, the nanotube is metallic; if n−m is a multiple of 3, then the nanotube is semiconducting with a very small band gap, otherwise the nanotube is a moderate semiconductor. Thus all armchair (n=m) nanotubes are metallic, and nanotubes (6,4), (9,1), etc. are semiconducting. In theory, metallic nanotubes can carry an electric current density of $4 \times 10^9$ A/cm2, which is more than 1,000 times greater than those of metals such as copper, where for copper interconnects current densities are limited by electromigration.

US 20120055013 (Finn; 2012) discloses microstructures such as connection areas, contact pads, antennas, coils, plates for capacitors and the like may be formed using nanostructures such as nanoparticles, nanowires and nanotubes. A laser may be used to assist in the process of microstructure formation, and may also be used to form other features on a substrate such as recesses or channels for receiving the microstructures. A smart mobile phone sticker (MPS) mounted to a cell phone with a self-sticking shielding element comprising a core layer having ferrite particles.

Magnetic Materials

A layer of magnetic material having magnetic particles may be supplied in sheet form. The composition of the magnetic sheet may be a layer of PET (polyethylene terephthalate) coated with magnetic particles having a mean size of approximately 10-100 μm (microns). Reference is made to TDK flexible composite electromagnetic sheet materials for improving communication performance in an RFID tag close to a metal case. The topography and dimensions of such magnetic particles can be dimensionally analyzed using a scanning electron microscope (SEM), and their chemical characteristics can be ascertained using an energy dispersive X-ray (EDX) spectrometer. Core layers of reinforcing and support material used in the production of magnetic sheets, such as PET, cannot readily be laminated to form a composite layer with the standard materials used in plastic cards and tags, such as PVC (polyvinylchloride) or PC (polycarbonate), and may typically require the addition of an adhesive layer.

Stainless Steel

Stainless steel, also known as inox steel, is a steel alloy with a minimum of 10.5% chromium content by mass. Stainless steel differs from carbon steel by the amount of chromium present. Unprotected carbon steel rusts readily when exposed to air and moisture.

Stainless steel may be used as a layer in smart cards (or RFID tags, and the like), and may also be used in telephone casings (and the like) to which an RFID tag (or the like) may be mounted.

Stainless steels contain sufficient chromium to form a passive film of chromium oxide, which prevents further surface corrosion by blocking oxygen diffusion to the steel surface and blocks corrosion from spreading into the metal's internal structure and, due to the similar size of the steel and oxide ions, they bond very strongly and remain attached to the surface.

Stainless steel is a relatively poor conductor of electricity, exhibiting only a few percent of the electrical conductivity of copper.

Ferritic and martensitic stainless steels are magnetic. Austenitic stainless steels are non-magnetic.

There are different types of stainless steels: when nickel is added, for instance, the austenite structure of iron is stabilized. This crystal structure makes such steels virtually non-magnetic and less brittle at low temperatures. For greater hardness and strength, more carbon is added.

Stainless steels are also classified by their crystalline structure:

Austenitic, or 200 and 300 series, stainless steels have an austenitic crystalline structure, which is a face-centered cubic crystal structure. Austenite steels make up over 70% of total stainless steel production. They contain a maximum of 0.15% carbon, a minimum of 16% chromium and sufficient nickel and/or manganese to retain an austenitic structure at all temperatures from the cryogenic region to the melting point of the alloy.

Ferritic stainless steels generally have better engineering properties than austenitic grades, but have reduced corrosion resistance, because of the lower chromium and nickel content.

Martensitic stainless steels are not as corrosion-resistant as the other two classes but are extremely strong and tough, as well as highly machinable, and can be hardened by heat treatment. Martensitic stainless steel contains chromium (12-14%), molybdenum (0.2-1%), nickel (less than 2%), and carbon (about 0.1-1%), giving it more hardness but making the material a bit more brittle. It is quenched and magnetic.

Duplex stainless steels have a mixed microstructure of austenite and ferrite.

Other pure metals and alloys are also applicable in the applications cited, their composition will determine the performance of the magnetic shield.

Some Patent References

EP 0754985 discloses a developing system having a housing (15) used to apply ink to the drum containing magnetic and pneumatic units (4, 5), for touching up the image. Inking of the drum (1) is achieved by applying a wave of solid particles of a pulverized pigment contained in the housing (15) using an ink deposit system. The ink wave moves in the opposite direction to that of the drum (1). The ink deposit system includes a magnetic drum (2) associated with a deflector (3) which is inclined with respect to set horizontal axis. The drum (2) rotates, in the opposite direction to the drum (1) at a set speed. The deflector (3) is arranged in front of a vertical line joining the centers of the drums (1, 2) by an adjustable amount.

Claim 1 of EP 0754985 refers to an inking device of a development drum comprising in an inking container (15) an inking function of the drum, a magnetic retouching function (4), a pneumatic retouching device (11) and a sealing device (12, 13) of the inking container (15) characterized in that the inking of the printing medium drum (1) is carried out by a wave of solid particles containing a magnetic pulverulent pigment contained in the inking container (15) raised by means (2, 3) of the inking device, the said wave displacing in the opposite direction to the displacement of the surface of the printing medium drum (1).

U.S. Pat. No. 7,481,884 discloses an apparatus and method for applying powder coatings to a substrate either directly or by intermediate transfer using a magnetic brush developer.

U.S. Pat. No. 7,615,256 discloses a process for mixing and gentle transport and transfer of powders to substrates.

U.S. Pat. No. 7,799,147 discloses a flaky soft magnetic metal powder and magnetic core member for RFID antenna. The performance index µ'×Q of a magnetic core member, in which a Fe—Si—Cr alloy is used, is further improved. A flaky soft magnetic metal powder, which is used in a magnetic core member for an RFID antenna comprising the above flaky soft magnetic metal powder and a binder, wherein it is composed of an Fe—Si—Cr alloy having an Ms (saturation magnetization)/Hc (coercive force) of 0.8 to 1.5 (mT/Am$^{-1}$) in an applied magnetic field of 398 kA/m. It is preferable that the flaky soft magnetic metal powder consists of 7 to 23 at % of Si, 15 at % or less of Cr (excluding 0), and the balance being Fe and inevitable impurities, and that it has a weight-average particle size $D_{50}$ of 5 to 30 µm and an average thickness of 0.1 to 1 µm.

U.S. Pat. No. 7,922,787 discloses methods for the solution-based production of silver nanowires by adaptation of the polyol process.

U.S. Pat. No. 7,537,874 discloses a toner having a high strength magnetite in an amount of from about 10 to about 40 weight percent, wherein the magnetite includes a material selected from the group consisting of FeO, Fe2O3, Fe3O4, gamma iron oxides, cobalt-gamma iron oxides, and mixtures thereof, and further including a developer having a carrier and toner as just described. It also discloses 4-40 micron total toner size to enable electrostatic movement, 77-150 micron magnetite good as carrier particles for magnetic brush.

The following patents may also be of interest:

U.S. Pat. No. 6,345,882 2002 Feb. 12 (Brechat; Nipson) Magnetographic printing process U.S. Pat. No. 6,120,142 2000 Sep. 19 (Eltgen et al.; Nipson) High-speed printer and the uses of such a printer U.S. Pat. No. 5,992,323 1999 Nov. 30 (Eltgen; Nipson) Printing process employing removable erasable image portions U.S. Pat. No. 5,644,987 1997 Jul. 8 (Eltgen; Nipson) Process and apparatus for printing using a magnetic toner which is electrostatically charged U.S. Pat. No. 5,610,633 1997 Mar. 11 (Eltgen; Nipson) Agent for magnetographic printers and use of such an agent

SUMMARY

It is a general object of the invention to provide techniques for improving the operation of RFID devices (smart cards, tags and the like) which either incorporate a metallized surface or which are mounted to metal surfaces. Other objects may include (but are not limited to):

reducing (or offsetting) attenuation effects of metal plates in contactless cards, including dual interface cards.

improving power transfer during wireless charging of devices such as mobile telephones, laptops and tablets transferring particles to substrates, such as one or more layers (which may be a stackup of layers) of a smart card which also may have a metallized layer, or an RFID tag which will be attached to a metal surface.

selective deposition of particles on substrate layers which will be used in smart cards or RFID tags making antennas for contactless cards, such as booster antennas (BA) and module antennas (MA)

configurations of booster antennas for contactless cards

As used herein, the term "selectively" coated (or deposited, and variations thereof), may refer to less than fully (completely) coating a substrate (such as a synthetic substrate for an RFID device) in a pattern corresponding to at least some (including substantially all) of the components of a booster antenna (for example). Typically, this may comprise coating only at least 10% and less than 90% of a substrate, or at least 20% and less than 80%, and various ranges (such as 30-70%) therebetween. One or more shielding layers may comprise one or more areas of magnetic material selectively disposed in a pattern corresponding to (aligned with) and covering at least a portion of one or more components of the booster antenna (BA).

According to some embodiments (examples) of the invention, generally, techniques are disclosed for selective deposition of magnetic material such as particles, and producing a pre-laminated stack of shielding layers for offsetting attenuation of RF caused by a metal face plate of a smart card (or tag) or a metallized layer near a passive transponder. Coated or uncoated magnetic particles of different sizes may be used to increase the packing density of the material after its deposition on a substrate. Magnetography-based techniques may be used to apply the particles, at high packing density, including different-sized particles to a substrate such as PVC. Magnetic particles may be used as a carrier medium to deposit other particles nanoparticles. A system for selective deposition is disclosed.

According to some embodiments (examples) of the invention, generally, magnetic material (such as particles) may be selectively deposited onto a substrate, such as a synthetic substrate, to serve as a shielding layer which may be incorporated into an RFID device to offset effects of a metallic layer (such as a metal faceplate of a metallized smart card) or a nearby metal object (such as a cell phone battery). Specific areas of a magnetic drum may be prepared with magnetic particles of different sizes prior to transferring the particles to the substrate. The magnetic particles may be disposed within a sandwich of other particles which may function as a binding agent for the magnetic particles. The magnetic particles may increase the mass of a smart card. The magnetic material (such as particles) may act as carriers for other particles which are transferred to the substrate, for example for depositing silver nanowires onto a substrate. Metal foils may be incorporated into a smart card.

According to some embodiments (examples) of the invention, an RFID device may comprise: one or more shielding layers comprising a layer of synthetic material selectively coated with magnetic material to create an electronic laminate for disposing between a transponder unit and a metal surface. The metal surface may be a faceplate for a metal smartcard or a metal element of another electronic device. A booster antenna (BA) may be disposed in a disposed in a layer of the device. The one or more shielding layers may comprise areas of magnetic material selectively disposed in a pattern corresponding to and covering at least a portion of one of more components of the booster antenna. Two or more shielding layers may be laminated together to form a composite layer. The magnetic material may comprise: a first portion of relatively large particles; and a second portion of relatively small particles at least partially filling voids between the relatively large particles. The relatively large particles may have a size of approximately 100 µm+/−50 µm. The relatively small particles may have a size of approximately 30 µm+/−20 µm. The relatively large particles may be, on average, approximately 2-3 times larger than the relatively small particles. Blends of relatively large particles and relatively small particles may exhibit selected ratios, by mass or by volume, to optimize the packing of the particles and to prevent leakage of electromagnetic field through the layer of magnetic particles. The magnetic material may comprise: magnetic particles acting as a carrier for functional materials, selected from the group consisting of pigments, amorphous crystalline powders, nanoparticles, tungsten particles, copper particles, iron particles, copper oxide particles. The magnetic particles, together with resin and carrier particles, may form a conglomerate of material comprising a plurality of magnetic carrier particles and metal or nanoparticles embedded in a resin that can be moved and placed by selective placement on a magnetized drum and electrostatic transfer to a substrate. At least some of the magnetic particles may be coated magnetic particles comprising a magnetic particle and a coating (224) covering the magnetic particle. A size for the magnetic particle may be in the range of 30 µm-100 µm. A thickness for the coating may be in the range of 1-5 µm. thickness of the coating may be less than 10% of the size of the magnetic particle. The coating may comprise one or more of a polymers, epoxy, a lubricant, and functional materials.

According to some embodiments (examples) of the invention, an RFID device may comprise: a booster antenna (BA) disposed in an inlay substrate; and a metal foil disposed on at least one side of the inlay substrate, having a thickness less than the skin depth of the metal or material being used in order to prevent the formation of eddy currents in the metal foil that will attenuate the RF electromagnetic field. A metal faceplate may be disposed above one side of the inlay substrate. Magnetic shielding material may be disposed between the metal faceplate and the inlay substrate. The metal foil may be disposed on both sides of the inlay substrate.

According to some embodiments (examples) of the invention, an RFID device may comprise: a module tape having a contact side and a chip side; at least one first antenna disposed on the chip side; and at least one second antenna disposed on the contact side. The at least first antenna may comprise a wire wound antenna. The at least one second antenna may comprise an etched antenna.

According to some embodiments (examples) of the invention, a method of selectively depositing magnetic particles onto a substrate, may comprise: selectively magnetizing (recording) zones of an imaging drum to have at least first zones with a relatively high magnetic strength and second zones with a relatively low magnetic strength. Relatively large magnetic particles may be attached to the first zones having relatively high magnetic strength. Relatively small magnetic particles may be attached to the second zones having relatively low magnetic strength. The relatively small magnetic particles may be attached after attaching the relatively large magnetic particles.

According to some embodiments (examples) of the invention, a shielding layer for use with a transponder unit having or being attached to a metal surface, may comprise: a layer of magnetic particles selectively disposed on the substrate along with particles of a binding agent. The layer of magnetic particles may be sandwiched between layers of binding agent. The layer of magnetic particles and binding agent may be disposed on a synthetic substrate. The layer of magnetic particles and binding agent may be disposed on an imaging drum. The particles of binding agent may comprise one or more of polymers or resins selected for their ability to improving adhesion of the magnetic particles to a substrate. The particles of binding agent may comprise one or more of pigments or dies that add color to a selectively deposited magnetic coating and nanoparticles with magnetic properties which enhance the shielding performance of the magnetic coating.

According to some embodiments (examples) of the invention, a system for selectively depositing particles on a substrate, may comprise: a magnetic transfer roller rotating in a first direction and carrying magnetic particles; a magnetized imaging drum rotating in a second direction, opposite to the first direction; a deflector blade for causing magnetic particles to be released from the surface of the transfer roller into a cloud of magnetic particles which are closely adjacent the magnetized surface of the imaging drum and moving generally in the same direction as the surface of the imaging drum, for being attracted to and attaching themselves to the recorded zones on the imaging drum, so that there will be a pattern of magnetic particles on the surface of the imaging drum. The system may comprise an electrostatic charging unit for charging magnetic particles on the imaging drum. The system may comprise means for transferring particles from the imaging drum to the substrate. A pattern of magnetic particles may be selectively deposited from the imaging drum onto a surface of a substrate. A pattern of relatively large magnetic particles on the imaging drum may be used as a carrier for relatively smaller metal particles which are selectively deposited from the imaging drum onto a surface of a substrate.

According to some embodiments (examples) of the invention, various profiles for deflector blades are disclosed, having generally triangular cross-sections. A leading edge (apex) strips magnetic particles off of a transfer roller, forming a cloud of particles which passes over an upstream surface of the deflector blade. The cloud may move in the same direction as the surface of the imaging roller, and particles in the cloud may attach themselves to recorded zones of the imaging roller. The upstream surface of the deflector blade may have a convex portion, a concave portion, ridges and the like.

According to some embodiments (examples) of the invention, a method of making a passive circuit or an RFID antenna may comprise: providing a synthetic paper substrate, such as a temperature-sensitive substrate or a transparent temperature sensitive substrate; spraying, inkjet printing or aerosol jet printing nanowires, such silver or cupronickel nanowires (typically 50 nm in diameter and 50 μm in length), to form a conductive network on the substrate, and using a suitable laser to pattern the network in creating an inductive and or capacitive circuit, such as by ablating the nanowire material to create gaps between conductive tracks. The method may further comprise first depositing or printing a binder on the substrate in a pattern representing the gap between the inductive tracks or capacitive elements; applying a nanowire network applied to the substrate; with a laser, cutting the nanowire network to produce a minimal insulation gap between conductive tracks; wherein the binder protects the underlying temperature sensitive substrate and prevents the re-deposition of the laser ablated metal in the gap area. The method may further comprise one or more of the following: applying binder to the top surface after the nanowires have been applied to the substrate; applying landing pads for interconnection with a chip module or die to the laser patterned nanowire network through gold sputtering, inkjet printing of conductive ink or any suitable method; and after mounting of the chip module or die and performing an electrical interconnection, laminating the resulting antenna substrate with other layers to form an electronic laminate.

Other embodiments (examples) may be disclosed, and may be claimed. Some interim products may be disclosed, and may be claimed.

The invention(s) described herein may relate to industrial and commercial industries, such as RFID devices and applications, smartcards, electronic passports and the like.

Other objects, features and advantages of the invention(s) disclosed herein may become apparent in light of the following illustrations and descriptions thereof.

BRIEF DESCRIPTION OF THE DRAWINGS

Reference will be made in detail to embodiments of the disclosure, non-limiting examples of which may be illustrated in the accompanying drawing figures (FIGs). The figures may generally be in the form of diagrams. Some elements in the figures may be exaggerated or drawn not-to-scale, others may be omitted, for illustrative clarity. Some figures may be in the form of diagrams.

When terms such as "left" and "right", "top" and "bottom", "upper" and "lower", "inner" and "outer", or similar terms are used in the description, they may be used to guide the reader to orientations of elements in the figures, but should be understood not to limit the apparatus being described to any particular configuration or orientation, unless otherwise specified or evident from context.

Figure 1:
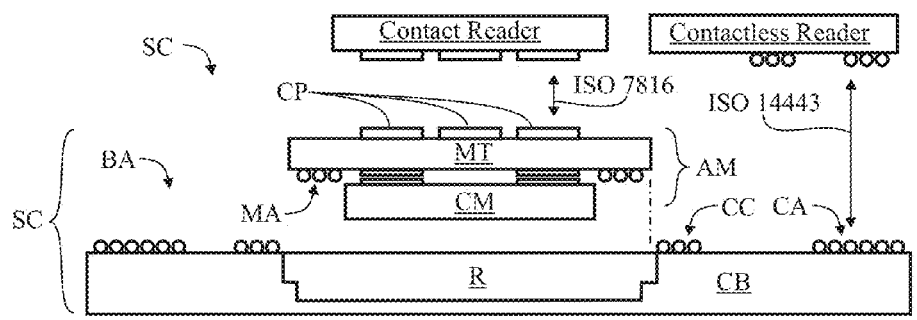

Different "versions" or iterations of elements may be referenced by reference numerals having the same numbers (###) followed by a different letter suffix (such as "A", "B", "C", or the like), in which case the similar elements may be inclusively referred to by the numeric portion (###) only of the reference numeral. Similar elements in different drawings may be referred to by similar numbers, differing in their most significant (typically hundreds) digit. Some elements may be referred to with letters (e.g., "BA", "CA", "CC", "EA" and the like), rather than (or in addition to) numerals (e.g., "12"). Any text (legends, notes, reference numerals and the like) appearing on the drawings are incorporated by reference herein.

Although the invention may be illustrated in the context of various exemplary embodiments, it should be understood that it is not intended to limit the invention to these particular embodiments, and individual features of various embodiments may be combined with one another.

FIG. 1 is a cross-section of a dual-interface smart card and readers.

Figure 1A:
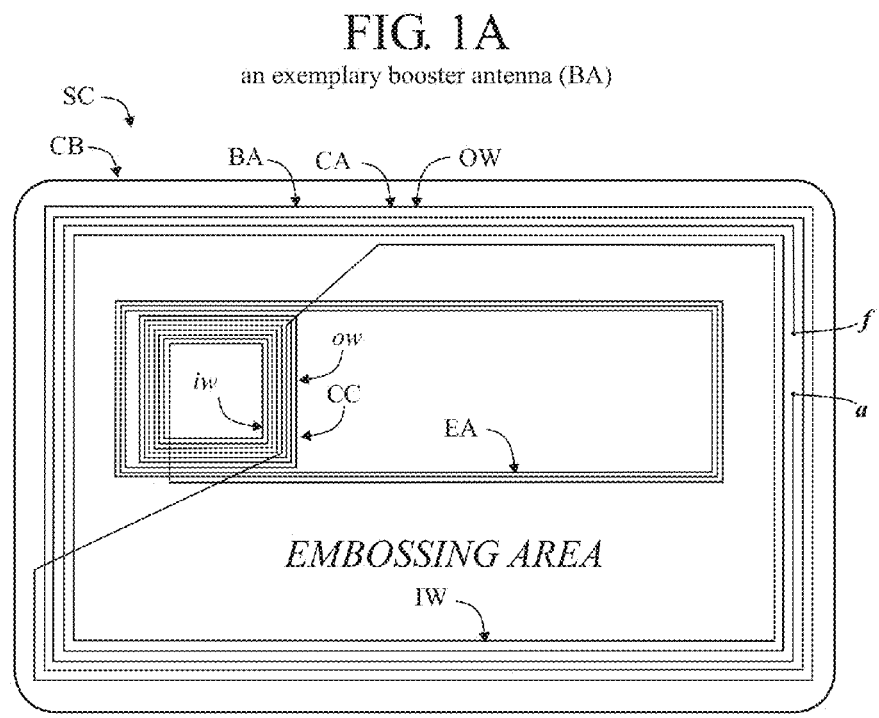

FIG. 1A is a diagram showing a configuration for a booster antenna (BA) of an smart card having a card antenna (CA) component, a coupler coil antenna (CC) component and an extension antenna (EA) component.

Figure 1B:
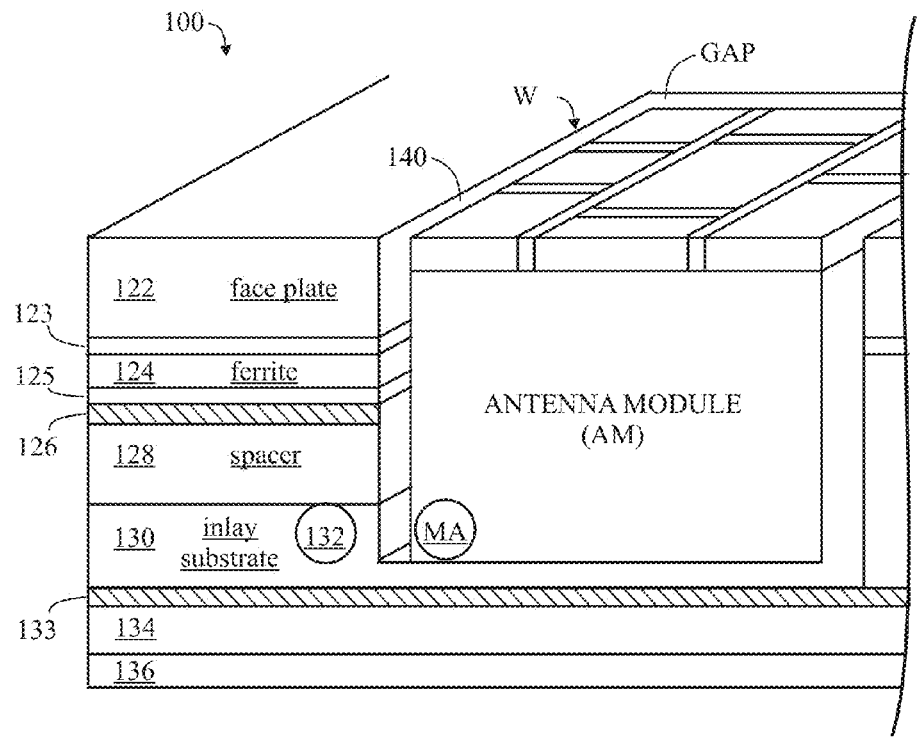

FIG. 1B is a partial diagrammatic perspective cut-view of a smart card with metallization.

Figure 1C:
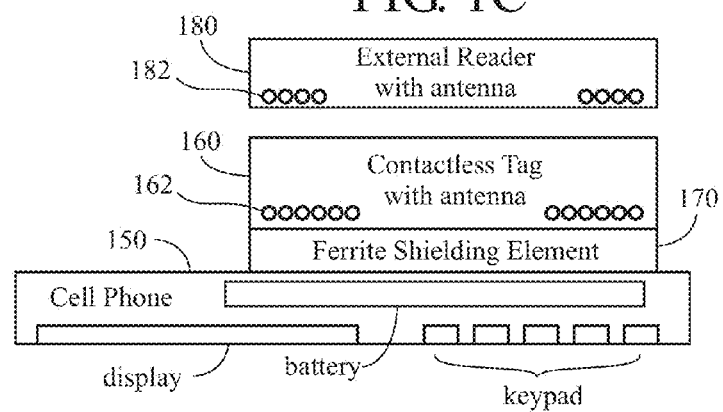

FIG. 1C is a cross-sectional view of a mobile phone sticker (MPS) on a cell phone.

Figure 2A:
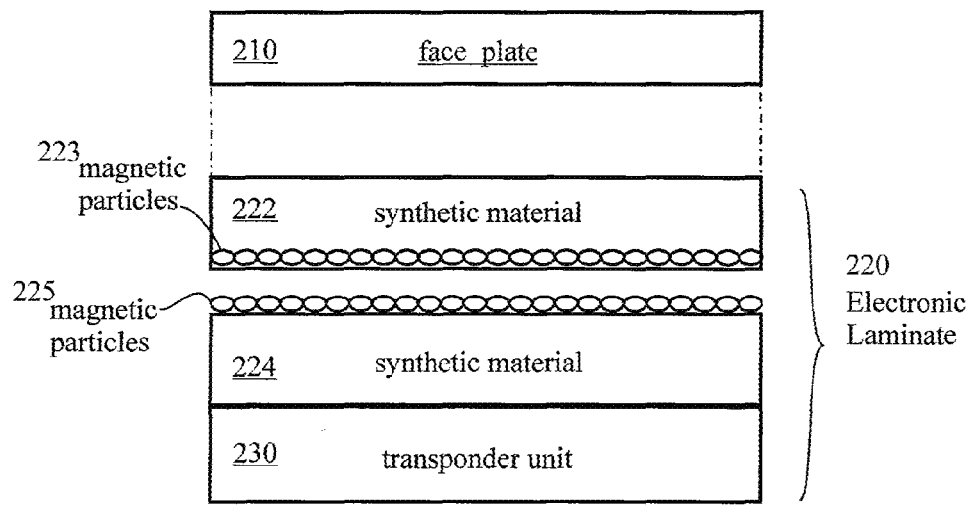

FIG. 2A is a diagram showing an exemplary embodiment of an electronic laminate comprising a transponder unit laminated to magnetic (shielding) layers which may reduce attenuation of the electromagnetic field generated by a reader when the electronic laminate is attached to a metal face plate (or other metal object).

Figure 2B:
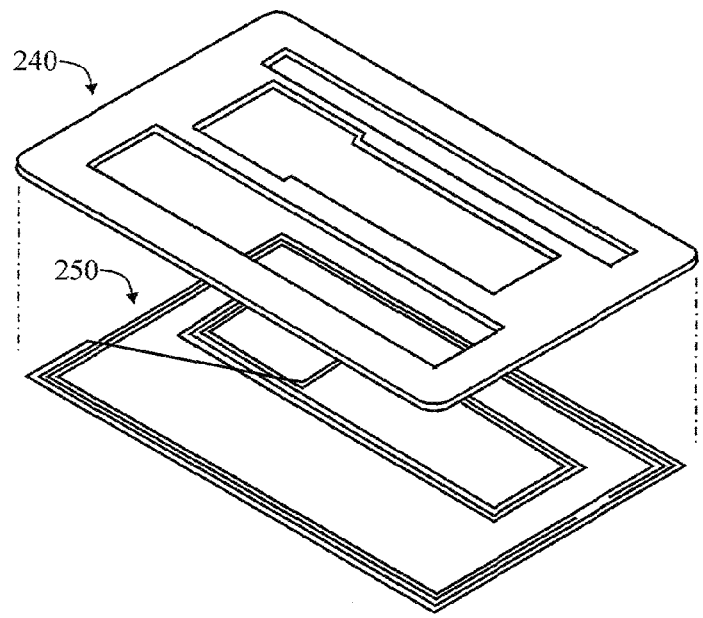

FIG. 2B is a diagram, in "exploded" perspective view, showing a booster antenna (BA) shielded by one or more "shielding layers" comprising magnetic particles selectively deposited in a pattern to cover or overlap components of a booster antenna (BA) in a smart card.

Figure 2C:
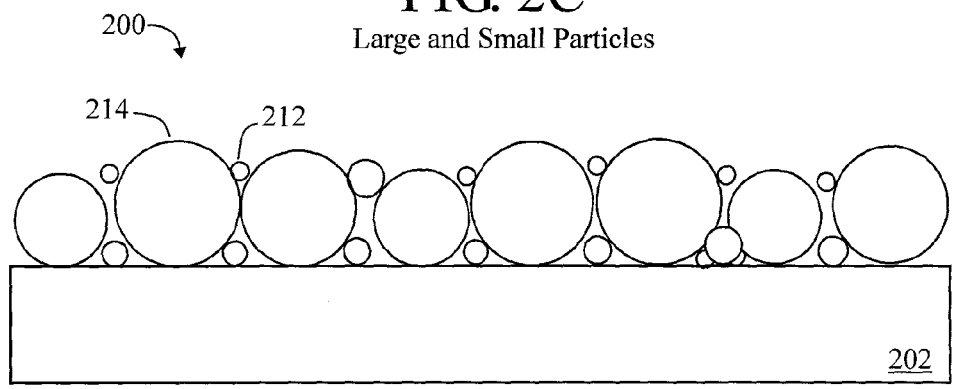

FIG. 2C is a diagram showing the packing density of magnetic spheres having different sizes on a substrate.

Figure 2D:
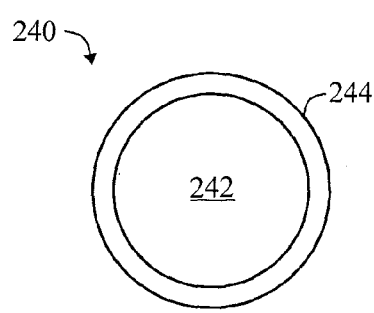

FIG. 2D is a cross-sectional view of a coated particle.

Figure 2E:
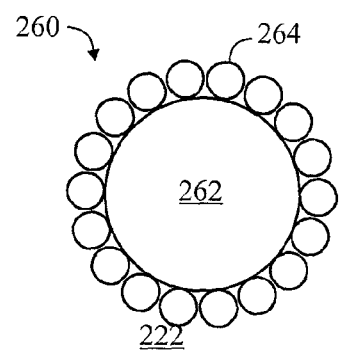

FIG. 2E is a cross-sectional view of a composite powder.

Figure 2F:
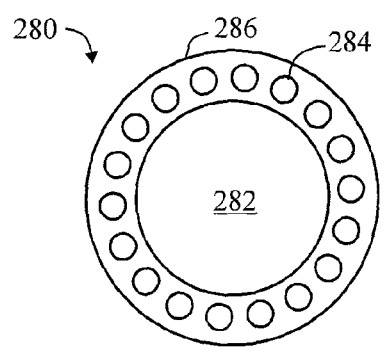

FIG. 2F is a cross-sectional view of a conglomerate.

FIG. 3 is a diagram showing a magnetography process using ink toner for printing images.

Figure 4A:
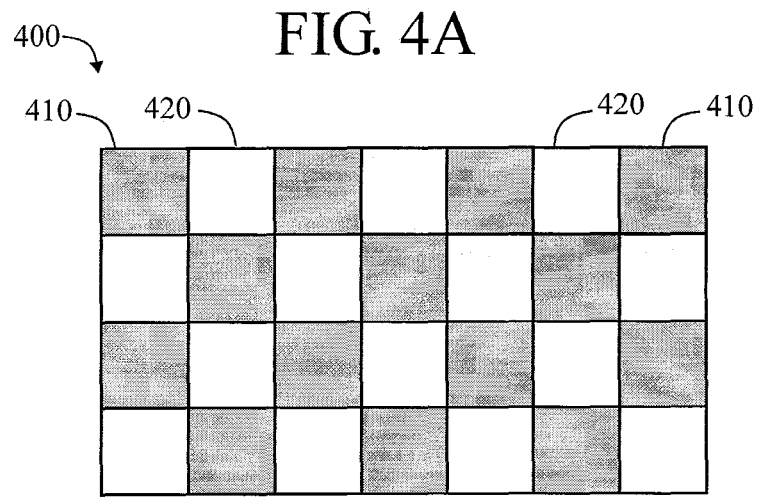
Figure 4B:
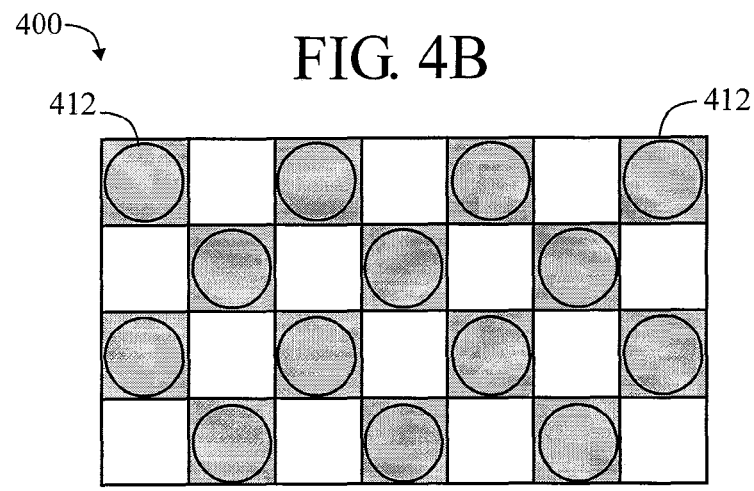
Figure 4C:
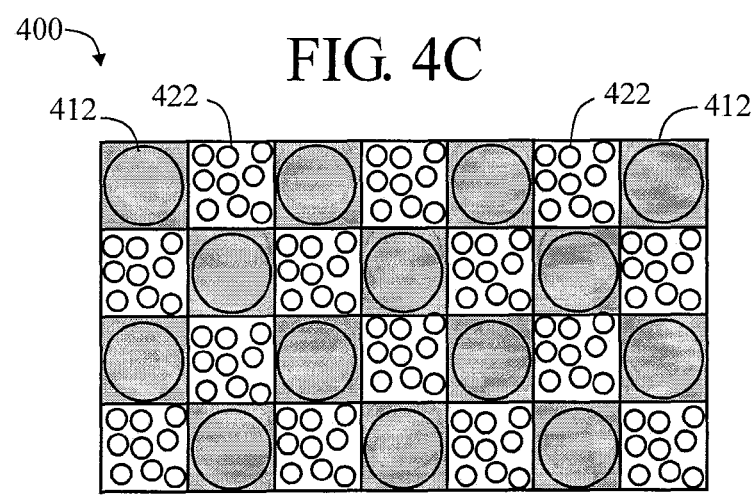

FIGS. 4A, 4B, 4C are diagrams showing how specific sections (areas, regions, portions) of a magnetic drum may be charged with different strength magnetic fields, and selectively coated with magnetic particles.

Figure 5A:
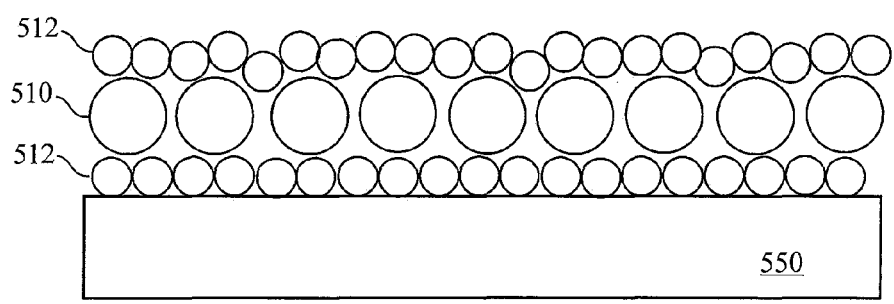

FIG. 5A is a diagram showing how magnetic particles may be bound to a substrate by using a binding agent for improved adhesion.

Figure 5B:
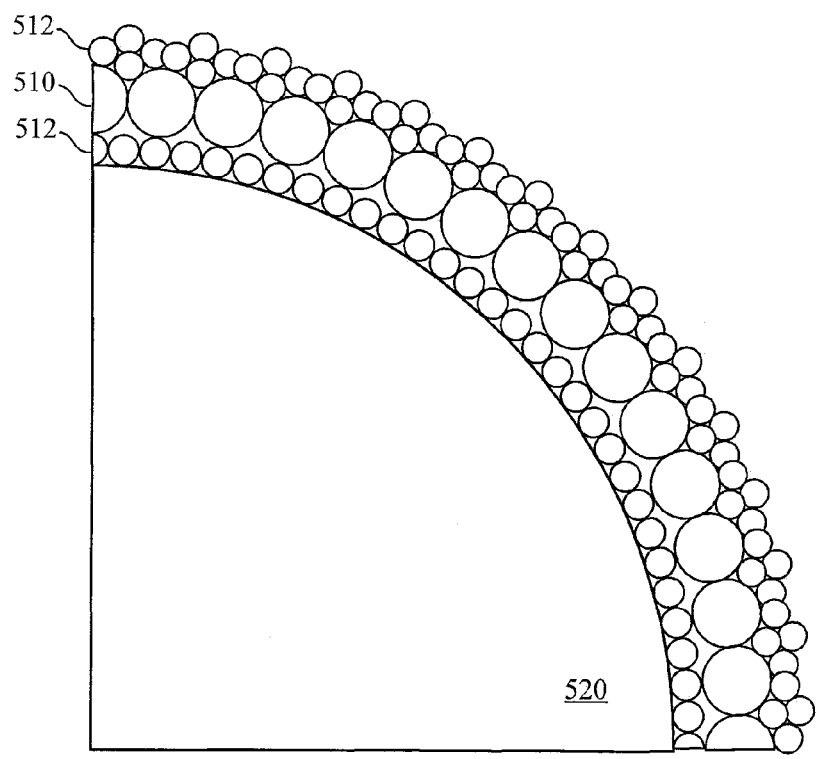

FIG. 5B is a diagram showing magnetic spheres on a magnetic drum sandwiched between layers of a binding agent.

Figure 6:
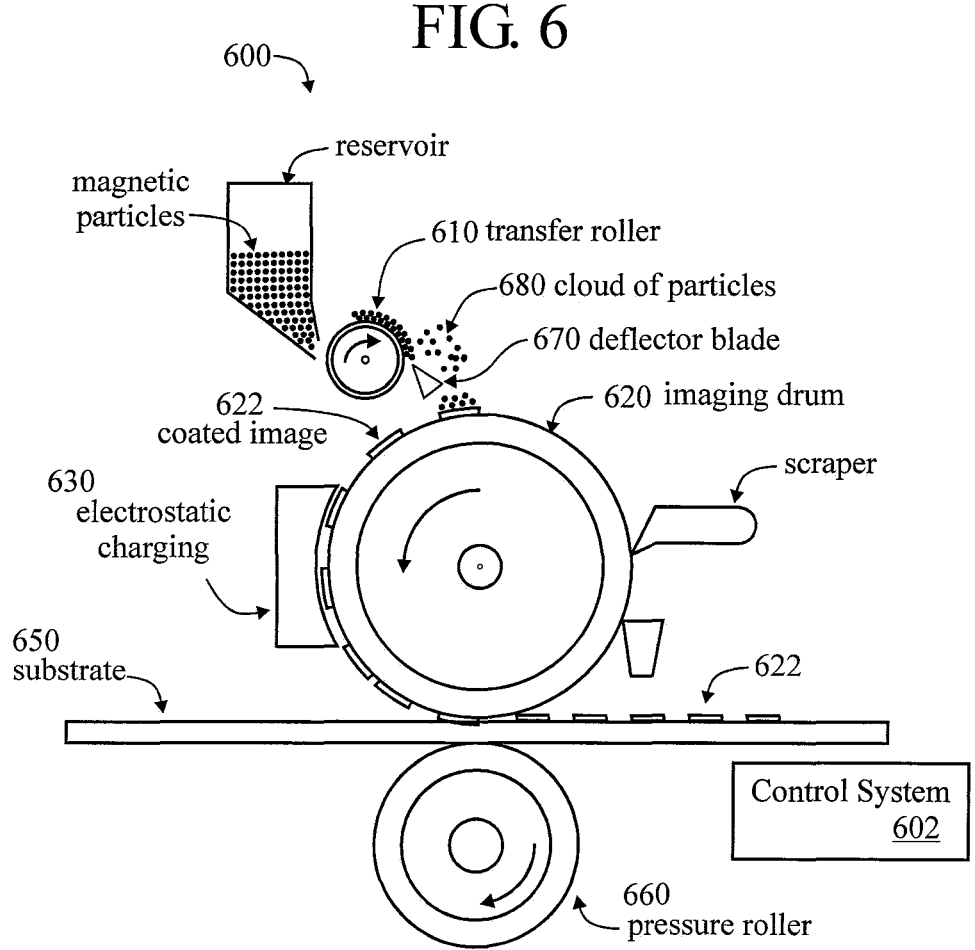

FIG. 6 is a diagram showing a magnetic particle coating process, including a deflector blade participating in the creation of a cloud of magnetic particles which may adhere to selected regions of a magnetic drum.

Figure 6A:
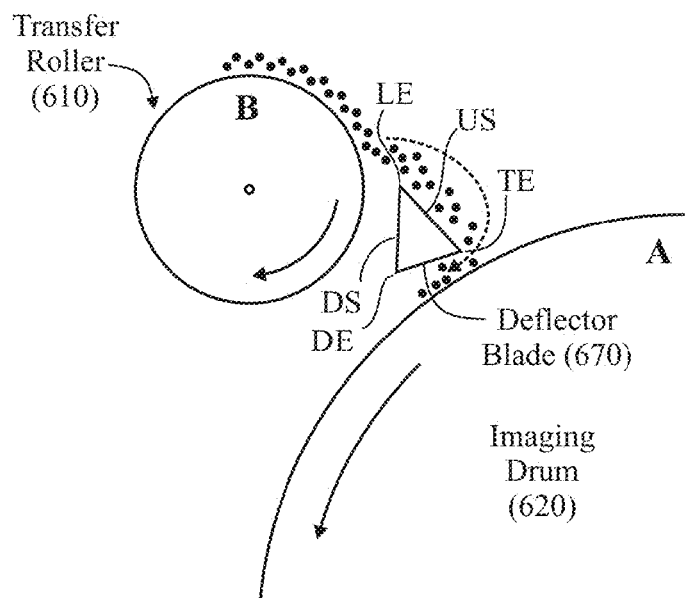

FIG. 6A is a diagram showing a portion of FIG. 6, in greater detail.

Figure 6B:
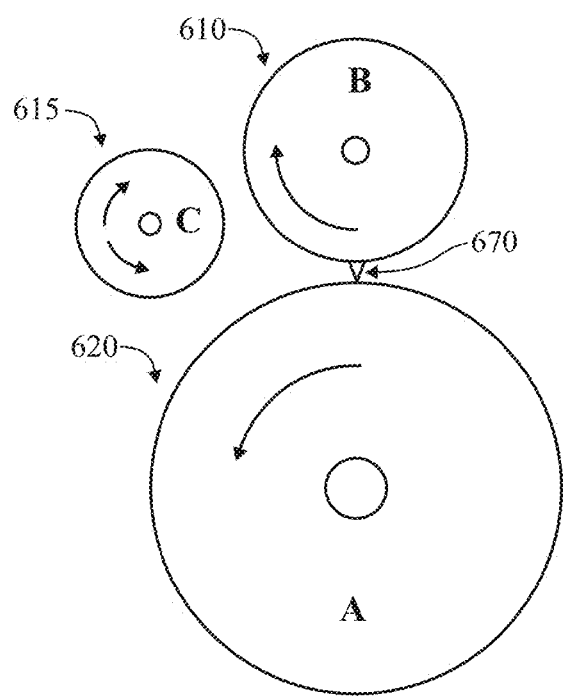

FIG. 6B is a diagram showing relative rotational directions of a magnetic imaging drum (A), magnetic transfer roller (B), and magnetic retouch roller.

FIGS. 7A-7F are diagrams showing some exemplary embodiments of deflector blades having different shapes and profiles, which may influence the creation of magnetic particle clouds.

Figure 8:
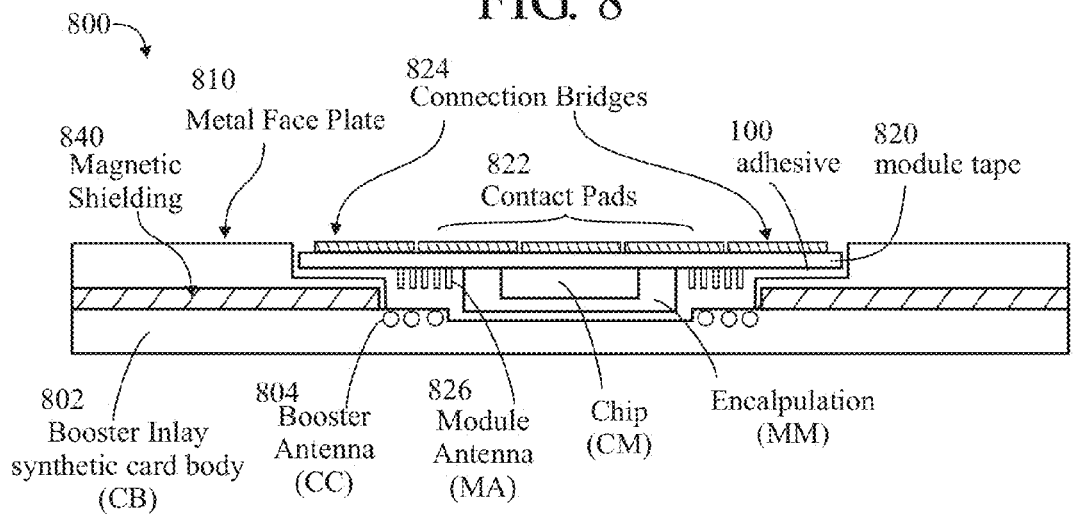

FIG. 8 is a diagram, in cross-section, showing magnetic shielding material in a smart card.

Figure 8A:
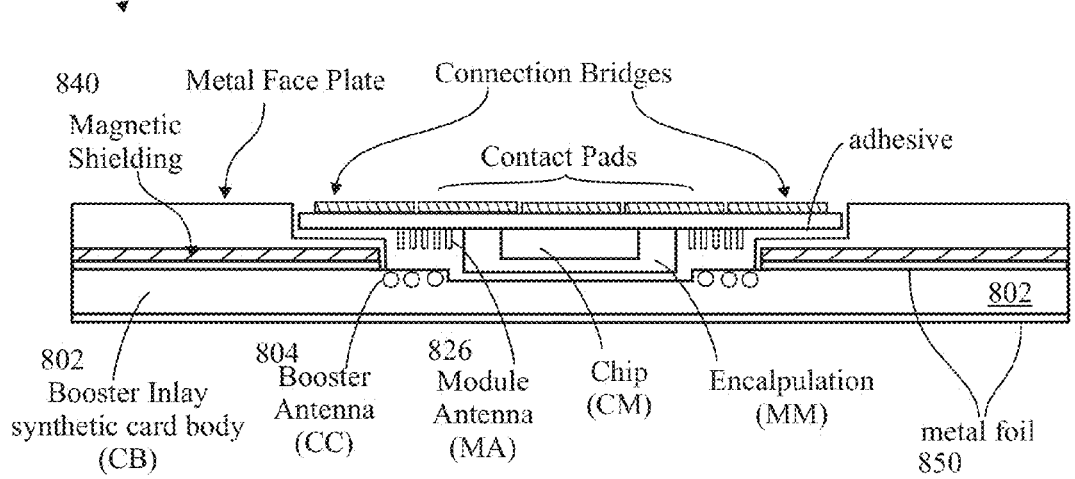

FIG. 8A is a diagram, in cross-section, showing metal foil(s) in a smart card.

Figure 9:
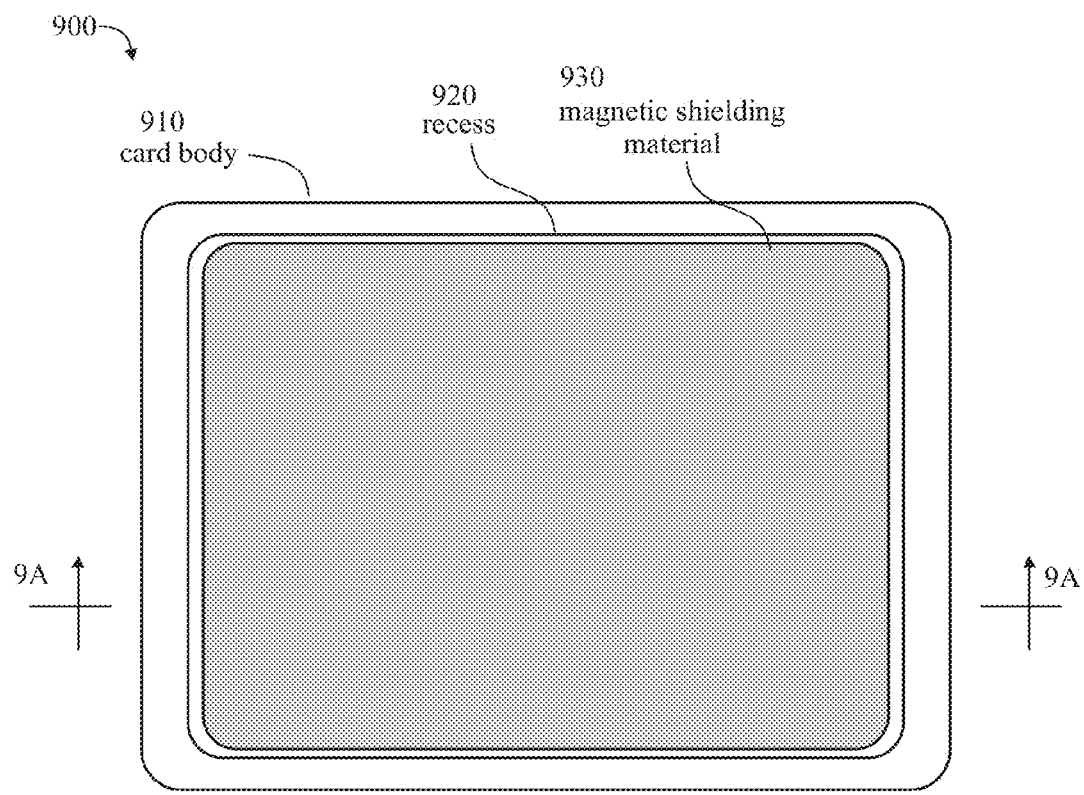

FIG. 9 is a diagram showing a smart card with shielding material in a milled/etched cavity.

Figure 9A:
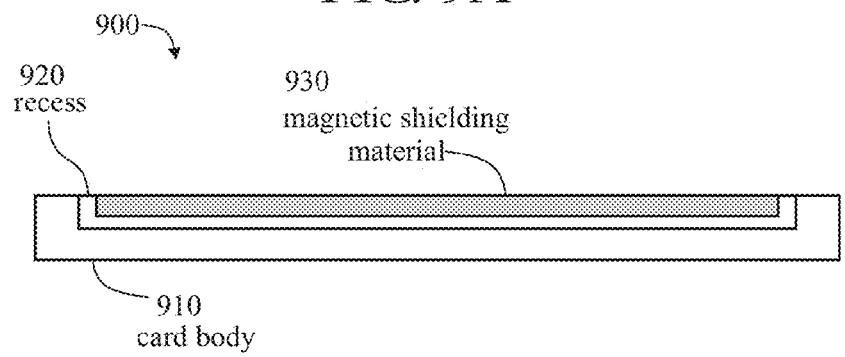

FIG. 9A is a cross-sectional view of the smart card of FIG. 9.

Figure 9B:
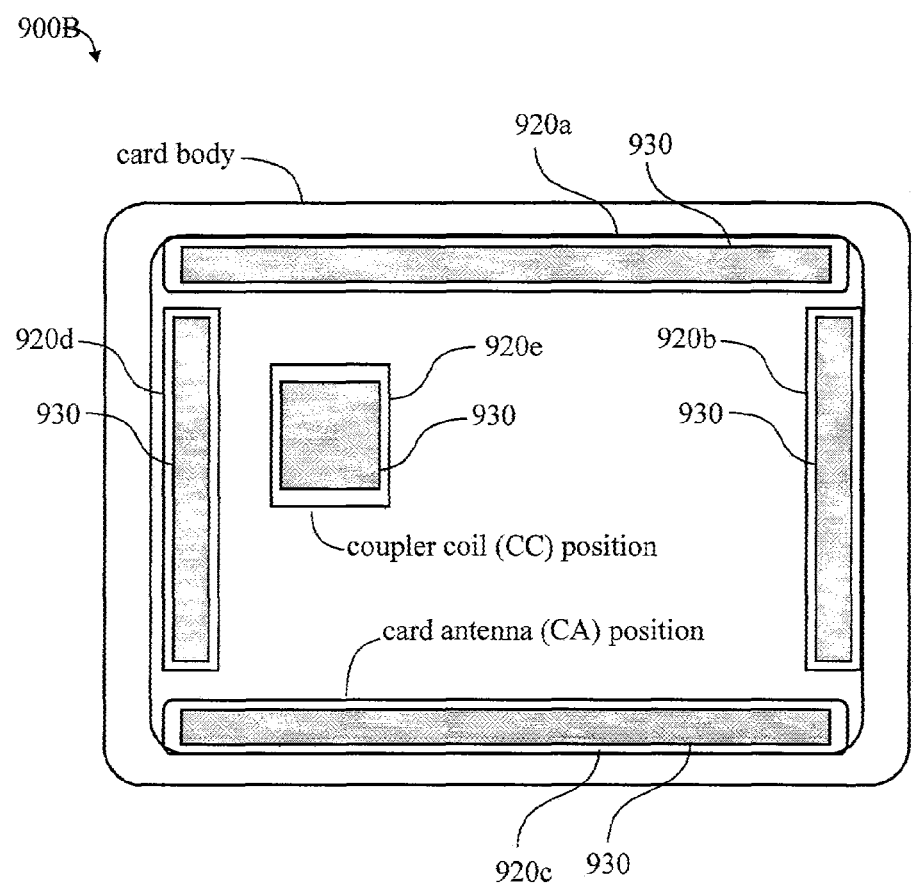

FIG. 9B is a diagram showing filling a smart card having a plurality of channels or recesses filled with magnetic shielding material.

Figure 10:
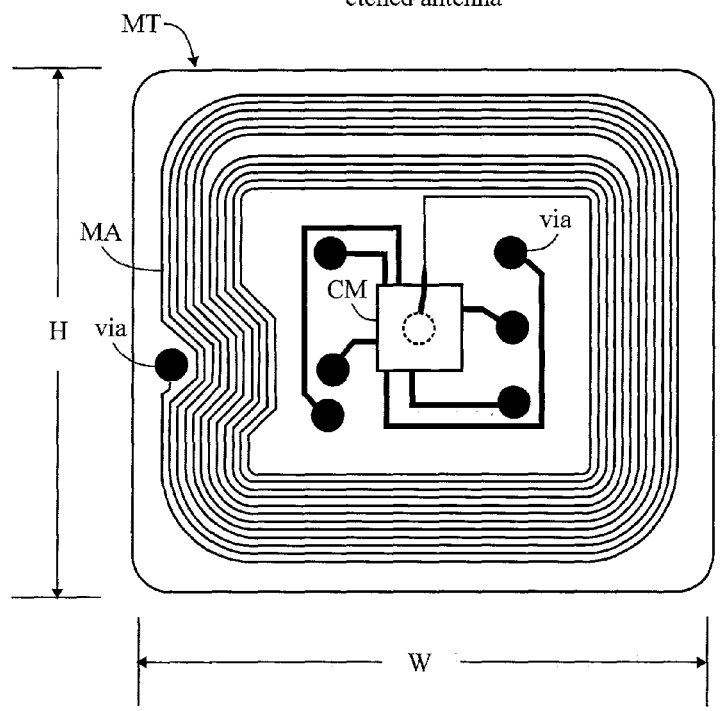

FIG. 10 is a diagram showing an etched antenna, such as may be used in an antenna module.

Figure 10A:
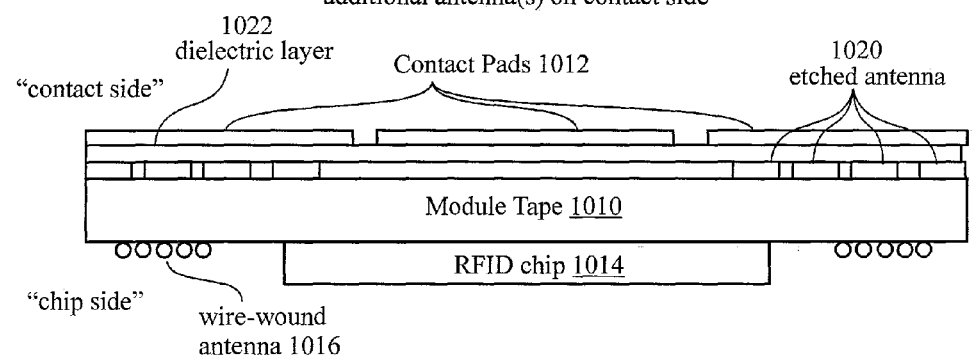

FIG. 10A is diagram showing an antenna module with wire wound antenna on the "chip side" and an etched antenna on the "contact side" of a module tape (MT).

Figure 11:
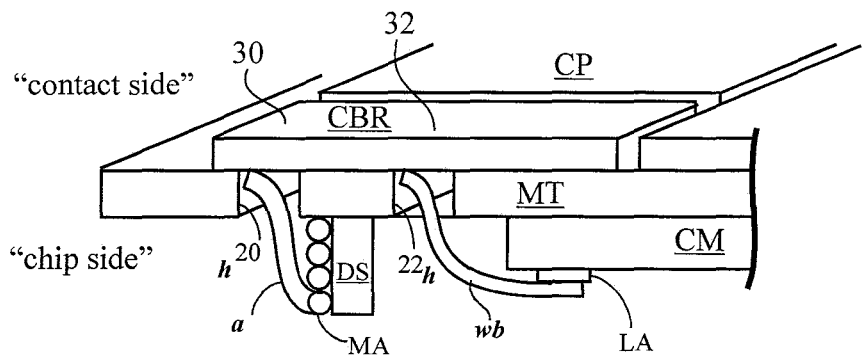

FIG. 11 is a cross-sectional view of a module tape (MT) having a connection bridge (CBR) for making connections from a components on a chip side of a module tape to components on a contact side of the tape.

Figure 12:
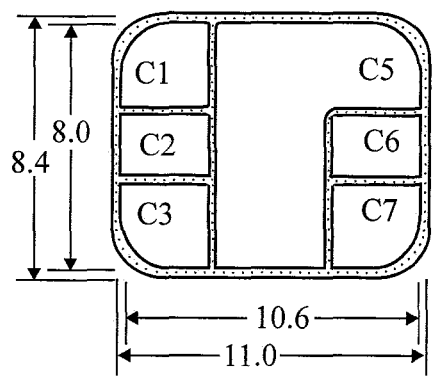

FIG. 12 is a diagram showing disposing functional material in gaps between contact pads and/or connection bridges.

Figure 13:
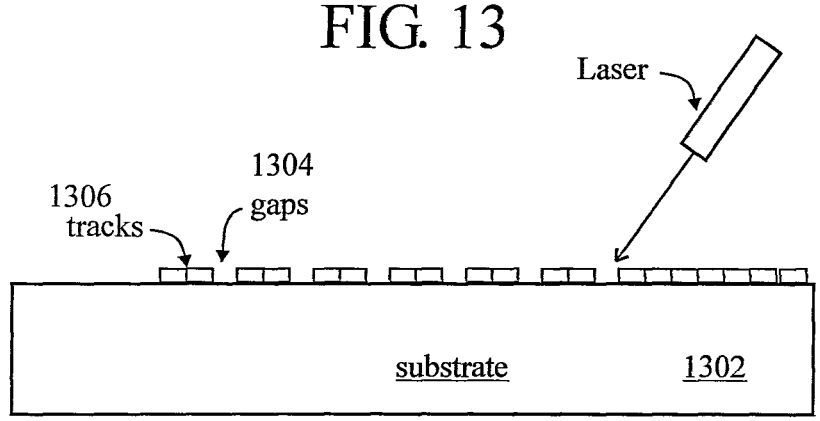

FIG. 13 is a diagram showing laser ablating (etching) a metal layer to form an etched antenna.

Figure 14A:
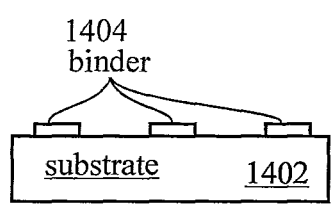
Figure 14B:
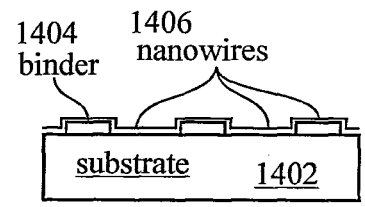
Figure 14C:
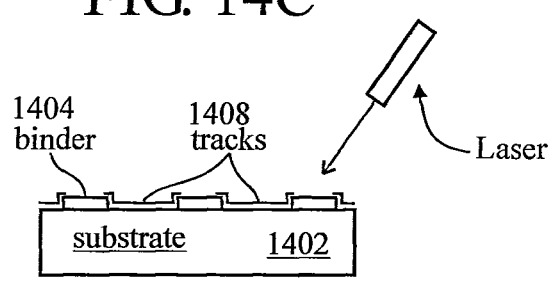

FIGS. 14A-14C are diagrams showing a technique for forming nanowire networks.

DETAILED DESCRIPTION

Various embodiments (or examples) may be described to illustrate teachings of the invention(s), and should be construed as illustrative rather than limiting. It should be understood that it is not intended to limit the invention(s) to these particular embodiments. It should be understood that some individual features of various embodiments may be combined in different ways than shown, with one another. Reference herein to "one embodiment", "an embodiment", or similar formulations, may mean that a particular feature, structure, operation, or characteristic described in connection with the embodiment is included in at least one embodiment of the present invention. Some embodiments may not be explicitly designated as such ("an embodiment").

The embodiments and aspects thereof may be described and illustrated in conjunction with systems, devices and methods which are meant to be exemplary and illustrative, not limiting in scope. Specific configurations and details may be set forth in order to provide an understanding of the invention(s). However, it should be apparent to one skilled in the art that the invention(s) may be practiced without some of the specific details being presented herein. Furthermore, some well-known steps or components may be described only generally, or even omitted, for the sake of illustrative clarity.

In the following descriptions, some specific details may be set forth in order to provide an understanding of the invention(s) disclosed herein. It should be apparent to those skilled in the art that these invention(s) may be practiced without these specific details. Any dimensions and materials or processes set forth herein should be considered to be approximate and exemplary, unless otherwise indicated. Headings (typically underlined) may be provided as an aid to the reader, and should not be construed as limiting.

In the main hereinafter, RFID devices and transponders in the form of secure documents which may be smart cards or national ID cards may be discussed as exemplary of various features and embodiments of the invention(s) disclosed herein. As will be evident, many features and embodiments may be applicable to (readily incorporated in) other forms of secure documents, such as electronic passports. As used herein, any one of the terms "transponder", "smart card", "data carrier", and the like, may be interpreted to refer to any other of the devices similar thereto which operate under ISO 14443 or similar RFID standard.

A typical data carrier described herein may comprise (i) an antenna module (AM) having an RFID chip or chip module (CM) and a module antenna (MA), (ii) a card body (CB) and (iii) a booster antenna (BA) disposed on the card body (CB) to enhance coupling between the module antenna (MA) and the antenna of an external RFID "reader". When "chip module" is referred to herein, it should be taken to include "chip", and vice versa, unless explicitly otherwise stated. The module antenna (MA) may comprise a coil of wire, conductive traces etched or printed on a module tape (MT) substrate for the antenna module (AM), or may be incorporated directly on the chip itself.

Smart Cards, Generally

A smart card (as an example of a RFID device, such as secure document, a smart card, an RFID tag, or a transponder device) may comprise an inlay substrate or card body (CB), an antenna module (AM), and a booster antenna (BA). The antenna module (AM) may comprise an RFID (radio frequency identification) chip or chip module (either of which may be referred to as "CM" or "IC") and a module antenna (MA). The RFID chip (CM) may be mounted on the "chip side" of a module tape (MT) and, in the case of "dual interface" (DI) cards, may have 6 or 8 contact pads (CP) on a "contact side" thereof for interfacing with a contact reader in a contact mode (ISO 7816-2). The booster antenna (BA), typically comprising several windings of wire in the card body (CB) may comprise various "antenna components", such as a card body antenna (CA) component for coupling with an external contactless reader, a coupling coil (CC) component for coupling with the module antenna (MA) of the antenna module (AM) and an extension antenna (EA) component for enhancing performance of the booster antenna (BA).

In the main, hereinafter, dual interface (DI) smart cards having both contact and contactless interfaces may be described, as exemplary of applications for some of the techniques disclosed herein, but it should be understood that the techniques may be applicable to smart cards (such as contactless entry cards) having only a contactless interface, as well as to other electronic devices and configurations, including other secure documents, RFID devices, tags, or transponder units.

FIG. 1 illustrates a dual interface (DI) smart card SC, along with a contact reader and a contactless reader. The smart card may comprise a card body CB substrate which may have a recess R which may be milled out for accepting an antenna module AM. A booster antenna BA having at least a card antenna CA component and a coupler coil CC component may be disposed on a surface of the card body CB. The booster antenna BA may comprise turns (or traces, or tracks) of wire (or other conductor) embedded in (or disposed on) the card body CB. The antenna module AM may comprise a module tape MT. An RFID chip CM may be disposed on one side of the module tape MT along with a module antenna MA for inductively coupling with the booster antenna BA. Contact pads CP may be disposed on the other side of the module tape MT for interfacing with the external contact reader. The smart card may interface with an external contactless reader using RF signals for exchanging data and for powering the RFID chip CM.

The booster antenna BA (and other features) disclosed herein may increase the effective operative ("reading") distance between the antenna module AM and the external contactless reader with capacitive and inductive coupling. With reading distances typically on the order of only a few centimeters, an increase of 1 cm can represent a significant improvement.

A passive transponder device comprising an RFID chip or die connected to an antenna may be incorporated as a chip module or antenna module AM in RFID devices such as smart cards, tags and security documents. The antenna (or module antenna "MA") can be wire wound, wire embedded, chemically etched (copper, silver, aluminum), sputtered and printed (conductive inks) on a variety of substrates. Such cards, tags and documents may comprise several substrate layers protecting the transponder device, and the layers may be laminated to form a composite product.

The descriptions that follow may be mostly in the context of dual interface (DI, DIF) smart cards, and may relate mostly to the contactless operation thereof. Many of the teachings set forth herein may be applicable to electronic passports, keyless (contactless) entry systems and the like having only a contactless mode of operation.

Booster Antennas

Booster antennas (BA) in the card body (CB) of a smart card improve coupling between the antenna module (AM) with an external contactless reader, Several examples of booster antennas (BAs) are shown and described in the following applications or publications.

U.S. Ser. No. 13/600,140 filed 30 Aug. 2012 (US 20130075477 published 28 Mar. 2013)
U.S. Ser. No. 14/020,884 filed 8 Sep. 2013
U.S. 61905134 filed 15 Nov. 2013
U.S. 61914996 filed 12 Dec. 2013
U.S. Ser. No. 14/173,815 filed 6 Feb. 2014

Generally, a booster antenna BA may comprise a single length of wire, having two free ends "a" and "f", mounted to (or embedded in) a surface of a synthetic substrate (or card body CB), and may comprise a card antenna CA component disposed around the periphery of the card body CB, a coupler coil CC component disposed at an interior area of the card body CB at a location corresponding to the location of an antenna module AM, and an extension antenna EA disposed at an upper portion of the card body CB.

Each of the booster antenna components (CA, CC, EA) may comprise several turns (or tracks) of wire which may be laid in a clockwise CW direction (with a first "sense") or in a counter-clockwise CCW direction (with an opposite "sense"). The pitch of the turns may be different for each of the booster antenna components (CA, CC, EA). The turns of a given booster antenna component (CA, CC, EA) may be organized into a number of turns comprising an inner winding (IW, iw) and a number of turns comprising an outer winding (OW, ow) disposed around the inner windings of the component. The laying of the various booster antenna components (CA, CC, EA) may involve wire crossing over previously laid components, or portions thereof.

FIG. 1A shows an exemplary booster antenna BA comprising a card antenna CA component, a coupler coil CC component and an extension antenna EA component. The overall booster antenna BA may have two free ends "a" and "f", and may be formed by embedding wire in an inlay substrate (or card body), such as in the following illustrative steps "1" to "5":

1. starting at the free end "a" of the card antenna CA component, laying the wire for the outer winding OW, in a clockwise CW direction, from an innermost turn to an outermost turn thereof, around (just within) the periphery of the card body CB (not shown),
2. then, crossing over the already laid turns of the outer winding OW of the card antenna CA component, heading towards the interior of the card body CB and commencing laying the wire for the coupler coil CC component, in a counter-clockwise CCW direction, from an outermost turn to an innermost turn thereof,
3. then, crossing over the already laid turns of the coupler coil CC component, commencing laying the wire for the extension antenna EA component, in a counter-clockwise CCW direction, from an outermost turn to an innermost turn thereof,
4. then, crossing over the already-laid turns of the extension antenna EA component, heading back towards the periphery of the card body CB and commencing winding the inner winding IW of the card antenna CA component in a clockwise CW direction, from an innermost turn to an outermost turn thereof, within the already laid outer winding OW,
5. finishing laying of the wire for the booster antenna BA at the free end "f", which may be (but need not be) close to the other free end "a".

Construction of a Metallized Card

Some smart cards, including dual interface (DI) smart cards, may incorporate a metallized top layer or face plate which is substantially the size of the card body, as described with respect to FIG. 1B. Having a metal face plate may significantly attenuate the RFID signals passing between the smart card or RFID tag and an external reader. Such smart cards, which may be referred to as "metal smart cards" may benefit from internal shielding measures, as disclosed herein, to offset the attenuation effects of the metal face plate. Similar measures may be applied to RFID tags or transponder units mounted on metal surfaces, such as have been described with respect to FIG. 1C.

Some of the techniques for offsetting attenuation may include for forming "shielding" layers comprising magnetic particles on surfaces of a substrate, such as a layer of a card body (CB), and these layers may function as "shielding layers" to offset attenuation of signals by the metal face plate or metal surface. The layer may be selectively deposited, having a pattern which, for example, may correspond to a pattern of the booster antenna (BA), or one or more portions (components) thereof. The shielding layer may comprise a synthetic material such as PVC (polyvinylchloride).

Some of the techniques disclosed herein may be applicable to the field of wireless charging of devices such as mobile telephones, laptops and tablets where the charging mechanism relies on power transfer from the charger to the device via inductive coupling (inductively coupled antennas).

FIG. 1B shows an exemplary stackup (sequence of layers) for a metallized smart card 100, having the following layers, structures and components. Exemplary dimensions may be presented. All dimensions are approximate. Thickness refers to vertical dimension in the figure.

A top layer 122 may be a metal (or metallized) layer, such as 250 μm thick stainless steel, and may be referred to as a "face plate". This top layer may be as large as the overall smart card, such as approximately 50 mm×80 mm.

A layer 123 of adhesive, such as 40 μm thick of polyurethane

A layer 124 of magnetic shielding material, such as 60 µm thick sheet of soft (flexible) ferrite A layer 125 of adhesive, such as 40 µm thick of polyurethane A layer 126 which may be a metal foil, such as less than 18 µm thick A layer 128 of plastic material, such as 50-100 µm thick PVC, which may function as a spacer (separating layers and components below from those above)

A layer 130 of plastic material, such as 150-200 µm thick PVC, which may function as the card body (CB) (or "inlay substrate").

Wire 132, such as 112 µm diameter wire, forming the booster antenna (BA) with coupler coil (CC). Only one wire cross-section of one booster antenna component is shown, for illustrative clarity.

A layer 133 which may be a metal foil, such as less than 18 µm thick

A layer 134 of plastic material, such as 150 µm thick PVC, which may include printing, magnetic stripe, etc.

A layer 136 of plastic material, such as 50 µm thick PVC, which may serve as an overlay The overall thickness of the smart card 200 (layers 202, 203, 204, 208, 210, 214, 216) may be approximately 810 µm (0.81 mm).

A window opening 140 ("W") may extend into the smart card from the face plate, through intervening layers, into the card body layer 130. A dual interface (DI) antenna module (AM), with module antenna (MA) may be disposed in the window opening. The window opening may extend completely through the card body layer 130, in which case the antenna module (AM) would be supported by the underlying layer 134.

The coupler coil (CC) of the booster antenna (BA) may surround the window opening 140 so as to be closely coupled with the module antenna (MA) of the antenna module (AM). Alternatively, the coupler coil (CC) may be disposed in the card body (CB) so as to be underneath the module antenna (MA) of the antenna module (AM).

The antenna module (AM) may measure approximately 12×13 mm (and approximately 0.6 mm thick). The window opening 220 ("W") in the face plate 202 may be approximately the same size as the antenna module (AM)—i.e., approximately 12×13 mm.

A "chip activation distance" is similar to "read distance", and represents the maximum distance at which the chip module may be activated (for reading) by an external reader. As a general proposition, a chip activation distance of 15 mm is not very good, 20 mm or 25 mm would be better. The chip activation distance in a metallized smart card is handicapped by attenuation of the electromagnetic field associated with the booster antenna attributable to the metallic face plate 122.

The magnetic shielding layer 124 may also improve coupling (and increase chip activation distance and read distance) by reducing attenuation of coupling by the face plate 122, helping to concentrate the electromagnetic field between the booster antenna BA and the module antenna MA of the antenna module AM. It may be desirable that the magnetic shielding layer 124 be as close as possible to the underside of the face plate 122. Rather than having a separate magnetic shielding layer 124 (and adhesive layer 123), magnetic shielding particles (or powder) may be mixed with an adhesive and sprayed or coated onto the underside of the face plate 122, thereby eliminating the intervening adhesive layer 123. Alternatively, rather than being in the form of a separate layer 124, the magnetic shielding material may be particles (including nanoparticles) of magnetic materials embedded in an underlying layer, such as the spacer layer 128 or the card body layer 130 (in some configurations, the spacer layer 128 may be omitted).

Attaching an RFID Tag to a Metal Body

RFID tags may comprise an RFID chip and associated antenna (which together may be referred to as a "transponder device") attached or laminated to a metallized casing or to a battery in a portable telephone. A layer of magnetic material with high magnetic permeability is usually adhesively fixed between the RFID tag and the metal or metalized substrate, for the purpose of reducing eddy current losses and to decouple the RFID tag from the underlying metal surface(s). This shielding in the high frequency band reduces attenuation of the carrier wave (typically 13.56 MHz) caused by inducing eddy currents on the metal surface of the casing or battery. Without such shielding measures, the eddy currents may create a magnetic field reversing the direction of the carrier wave. Passive devices such as RFID tags and smart cards, without their own internal power source, may rely on harvesting power from an external reader in order to operate.

FIG. 1C illustrates a cell phone 150 having a display and a keypad on its front surface (facing down in the figure), and containing a battery pack ("battery"). A contactless RFID device ("tag") 160 is disposed on the back (top, as viewed) surface of the phone. The tag has an antenna 162 inside for interacting with an external RFID reader 180. The antenna 162 may be the booster antenna (BA) mentioned above, or simply a sole antenna integral with the tag. The reader 180 also has an antenna 182 associated therewith, typically much larger than illustrated.

The tag is exemplary of a mobile phone sticker (MPS) which may be used for e-payment, e-ticketing, loyalty and access control applications.

A magnetic (or other suitable material) shielding element 170 is disposed between the back of the cell phone and the RFID tag to alleviate (reduce) attenuation of coupling between the tag and the reader. The element may be in the form of a film or tape, and may have adhesive on both sides for sticking the contactless tag to the phone. Double-sided tapes having adhesive on both sides are well known, such as for mounting carpets.

The magnetic (or ferrite) shielding element may comprise
- a core layer (or substrate) which may be in the form of an elongate tape measuring a few centimeters wide and having two surfaces and having ferrite (or other) particles (including nanostructures) dispersed throughout
- an adhesive layer on a bottom surface of the tape
- an adhesive layer on a top surface of the tape, and
- a release layer which will be peeled off and discarded, protecting the top adhesive layer.

The magnetic (or ferrite) shielding element may reduce adverse effects caused by proximity of the contactless tag with an external metal element (such as the battery casing) of another electronic device (such as the cell phone).

Magnetic Particles

As used herein, "magnetic particles" may comprise (i) soft magnetic (paramagnetic) compounds such as ferrites including manganese-zinc ferrites and nickel zinc ferrites, (ii) hard magnetic (ferromagnetic) ferrite alloys such as strontium ferrite, barium ferrite and cobalt ferrite, and (iii) specially formulated non-ferrite magnetic alloys comprising Iron (Fe), Silicon (Si), Silicon dioxide ($SiO_2$) and Chromium (Cr) or Aluminum (Al) and other elemental constituents.

The coercivitiy of paramagnetic materials, as described herein, should be low, such as approximately 15 Gauss. In the traditional printing industry the magnetic materials used were typically ferromagnetic. For the purposes of shielding from reverse eddy currents (in the context of smart cards having a metal plate, for example), the magnetic material should be paramagnetic.

A solid metal plate, for example credit card sized, may comprise stainless steel having a variety of compositions rendering the steel with different magnetic properties. For effective shielding of induced eddy currents the steel should be non-magnetic at room temperature and should have low electrical conductivity.

A magnetic shield ("shielding layer") may be incorporated into the smart card (or RFID tag) to offset (reduce or counteract) the adverse effects of a metallized surface in the card or a metal object to which the RFID tag is attached. The efficiency of the shielding layer may be determined by the packing density of the magnetic particles.

Antenna Modules (AM)

A problem with any arrangement which incorporates the antenna into the chip module (antenna module AM) is that the overall antenna area is quite small (such as approximately 15 mm×15 mm), in contrast with a more conventional antenna which may be formed by embedding several (such as 4 or 5) turns of wire around a periphery of the of the inlay substrate or card body of the secure document, in which case the overall antenna area may be approximately 80 mm×50 mm (approximately 20 times larger). When an antenna is incorporated with the chip module, the resulting entity may be referred to as an "antenna module".

U.S. Pat. No. 8,261,997 (NXP) discloses a carrier assembly for receiving an RFID transponder chip has an attachment side for being attached to a consumer device and an operation side for receiving an RF signal in operational use of the RFID transponder chip.

. . . there is provided an electrically conductive shielding layer at the attachment side. The effect of this layer is that it effectively shields the transponder from the material of the surface on which the transponder is to be provided. The shielding layer has some detuning effect on the resonance frequency, but once this detuning effect has been taken into account in the antenna design, there is hardly any further detuning effect due to the surface on which the RFID transponder is provided, i.e. the RFID transponder comprising the carrier assembly of the invention is suitable for virtually any surface.

. . . the magnetic layer comprises a ferrite foil or a ferrite plate.

. . . the electrically conductive shielding layer comprises a material selected from a group comprising: copper, aluminum, silver, gold, platinum, conductive paste, and silver ink.

(Claim 1) A carrier assembly for receiving an RFID transponder chip, the carrier assembly having an attachment side for being attached to a consumer device and having an operation side for receiving an RF signal in operational use of the RFID transponder chip, wherein: the carrier assembly comprises a layer stack that includes an antenna layer, a magnetic layer, and an electrically conductive shielding layer; the antenna layer is arranged between the operation side and the magnetic layer; the electrically conductive shielding layer is arranged between the magnetic layer and the attachment side; the antenna layer comprises an antenna having contacts for being coupled to the RFID transponder chip; and an outer contour of a first projection of the antenna in a direction perpendicular to the antenna layer fully encloses an outer contour of a second projection of the electrically conductive shielding layer in the direction perpendicular to the antenna layer.

EP 1854222 A2 (NXP) discloses A mobile communication device (1, 10) comprises shielding components that provide electromagnetic shielding or attenuation between a first area (A) and a second area (B, B1, B2) within and/or external of the communication device (1, 10). In said first area (A) an antenna (4) and at least one ferrite (6) are arranged, which ferrite (6) is provided to interact with said antenna (4) and to guide a magnetic flux between said first area (A) and said second area (B, B1, B2).

[0001] a mobile communication device comprising shielding components, which cause electromagnetic shielding or attenuation between a first area and a second area within and/or external of the communication device.

[0008] A mobile communication device comprising shielding components, which cause electromagnetic shielding or attenuation between a first area and a second area within and/or external of the communication device, wherein in said first area an antenna and at least one ferrite are arranged, which ferrite is provided to interact with said antenna and to guide a magnetic flux between said first area and said second area.

[0019] The first device portion 1a contains a carrier 3, such as a printed circuit board. The FIGS. 1-2 also show a first area A and a second area, the latter consisting of an internal second area B1 and an external second area B2. The first area A and the internal second area B1 within first device portion 1a are separated from each other by the carrier 3. On the surface of this carrier 3, facing said first area A, an antenna 4 and a reader 5 are located. The antenna 4 is assumed to be a metallic layer on carrier 3 and is thus not visible in the side views of FIGS. 1 and 2. The reader 5 sends and receives electromagnetic signals via the antenna 4. For instance, the reader 5 may be configured as a near-field communication device or as an RFID device for communicating with wireless RF transponders. Second device portion 1b shields electromagnetic fields, either due to electromagnetically shielding materials used for structural elements of said second device portion 1b, or due to electromagnetically shielding means and elements incorporated in said second device portion 1b, such as a display with metallic layers, a PCB with grounding layers, batteries, electronic components or the like.

[0024] . . . although this is not shown in the FIGS. 3-4—the mobile communication device 10 may also comprise an internal second area B1 and an external second area B2 as shown FIGS. 1-2 in the case where the first device portion 10a comprises shielding components (i.e. the carrier 3).

(Claim 1) 1. A mobile communication device (1, 10) comprising shielding components, which cause electromagnetic shielding or attenuation between a first area (A) and a second area (B, B1, B2) within and/or external of the communication device (1, 10), wherein in said first area (A) an antenna (4) and at least one ferrite (6) are arranged, which ferrite (6) is provided to interact with said antenna (4) and provided to guide a magnetic flux between said first area (A) and said second area (B, B1, B2).

Foil Composite Card

US 2009/0169776 (2009; Herslow) discloses composite cards which include a security layer comprising a hologram or diffraction grating formed at, or in, the center, or core layer, of the card. The hologram may be formed by embossing a designated area of the core layer with a diffraction pattern and depositing a thin layer of metal on the embossed layer. Additional layers may be selectively and symmetrically attached to the top and bottom surfaces of the core layer. A laser may be used to remove selected portions of the metal formed on the embossed layer, at selected stages of forming the card, to impart a selected pattern or information to the holographic region. The cards may be "lasered" when the cards being processed are attached to, and part of, a large sheet of material, whereby the "lasering" of all the cards on the sheet can be done at the same time and relatively inexpensively. Alternatively, each card may be individually "lasered" to produce desired alpha numeric information, bar codes information or a graphic image, after the sheets are die-cut into cards.

claim 18. A method for forming a document comprising the steps of:
forming a pattern on a surface of a clear plastic sheet defining the core layer of said document;
vapor depositing one of a thin layer of a selected metal and a metal compound on a designated area of the formed pattern for producing a patterned layer and causing a light pattern to be produced corresponding to the formed pattern in response to incident light;
attaching a selected number of clear plastic buffer layers to the patterned layer formed on said surface of the core layer, arbitrarily defining said surface as the top surface, and a like number of clear plastic buffer layers on the bottom surface of the core layer; the first clear plastic layer being of approximately the same thickness as the second clear plastic layer; and
selectively modifying the thin layer of said selected metal and metal compound to customize the document.

Metal Card

US 2011/0189620 (2011; Herslow) discloses a method and apparatus for treating a selected region of a metal layer, used to form a metal card, by annealing the selected metal region so the selected region becomes soft and ductile, while the rest of the metal layer remains stiff. The softened, ductile, selected metal region can be embossed with reduced power and with reduced wear and tear on the embossing equipment. Alternatively, the annealed metal layer can undergo additional processing steps to form an assembly which can then be embossed. The method may include the use of a fixture for holding the metal layer, with the fixture having a window region for enabling heat to be applied to soften the region of the metal layer within the window region. The fixture includes apparatus for cooling the portion of the metal layer outside of the window region and for preventing the temperature of the metal layer outside the window region from rising above predetermined limits.

Ferrite

U.S. Pat. No. 8,158,018 (2012; TDK) discloses a ferrite sintered body contains main components consisting of 52 to 54 mol % Fe.sub.2O.sub.3, 35 to 42 mol % MnO and 6 to 11 mol % ZnO as oxide equivalents and additives including Co, Ti, Si and Ca in specified amounts, and has a temperature at which the power loss is a minimal value (bottom temperature) of higher than 120.degree. C. in a magnetic field with an excitation magnetic flux density of 200 mT and a frequency of 100 kHz, and a power loss of 350 kW/m.sup.3 or less at the bottom temperature.

U.S. Pat. No. 7,948,057 (2011; TDK) discloses a ferrite substrate, a winding-embedded ferrite resin layer, and an IC-embedded ferrite resin layer are laminated, the ferrite substrate has a ferrite first protruding part that protrudes into the ferrite resin layer from the surface thereof, the winding inside the ferrite resin layer is arranged winding around the first protruding part, and the IC overlaps the first protruding part in the resin layer. According to this configuration, high integration can be achieved, and the IC is arranged at a site where the ferrite first protruding part, the height of which fluctuates little as a result of thermal expansion, overlaps the ferrite resin layer, the thickness of which is thinned by the first protruding part and varies little as a result of thermal expansion, minimizing variations in the gap between the winding and the IC as a result of thermal expansion, and achieving greater stability of electrical characteristics.

U.S. Pat. No. 6,817,085 (2004; TDK) discloses a method of manufacturing a multi-layer ferrite chip inductor array including an element main body composed by laminating a ferrite layer and a conductor layer in such a manner that the laminated face thereof is vertical with an element mounting surface. The method also includes furnishing a plurality of coil shaped internal conductors within the element main body, in which a coiling direction of the coil shaped internal conductor is in parallel with the element mounting surface, forming the ferrite sheets with through-holes and printing the ferrite sheets with a plurality of coil shaped internal conductors and conductor patterns with an electrically conductive material.

U.S. Pat. No. 6,329,958 (2001; TDK) discloses an antenna structure may be formed by arranging a current-restricting structure upon a conductive surface. The current-restricting structure may be formed from a ferrite material, and may be in forms including a belt, tiles, or a patterned deposited layer. The conductive surface may be associated with a vehicle or structure. The current-restricting structure alters the paths taken by current on or beneath the conductive surface when a voltage is applied between portions of the surface.

Shielding Layer(s)

In traditional RFID systems that include metal surfaces, there is a separation between the magnetic shielding (directly attached to the metal) and the transponder (antenna connected to chip).

The transponder (or antenna structure) and the magnetic shielding layer and metal may be in intimate contact with one another, or may have minimal separation between each other in order to meet the ISO 7816 standard credit card thickness of 0.78 mm (780 μm). This restriction on the dimensions of the transponder inlay layer and the magnetic shielding layer presents a technical challenge. In reality, for dual interface (DI) smart cards, the thickness limitations are more severe. The metal face (plate) of the card should have good rigidity with a high quality surface finish; this may require a minimum thickness for the metal plate of at least 300 μm, such as approximately 350 μm. Accounting for the thickness of the metal face and other decorative or protective layers, this leaves approximately 250 μm thickness for the transponder/antenna inlay layer (including the magnetic shield).

Selective deposition of the magnetic particles in selected areas of one or more layers of the credit card may be used to create one or more shielding layers which may be stacked up and laminated under pressure and elevated temperatures to produce a pre-laminate shielding layer having a thickness of approximately 150-200 μm). The areas having magnetic particles may correspond to, or overlap, at least a portion of selected components (CA, CC, EA) of the booster antenna BA, including at least a portion (some of the turns or tracks) of a given booster antenna component (CA, CC, EA). The remaining areas of the pre-laminated shielding layer(s)—those areas which do not have magnetic particles deposited thereupon—may improve the adhesion between layers and may also improve the performance of the magnetic shielding material itself.

The magnetic shielding particles (whether coated or uncoated) onto substrates (such as pre-heated or electro-statically charged, as disclosed herein) may be deposited by magnetography (employing various techniques, as disclosed herein).

The magnetic materials (particles) referred to herein may have a variety of shapes including spherical, flat, flakes or rod-like and may have a distribution of particle sizes typically within the range 10 nm (nanometers) to 150 µm (microns). These magnetic particles may be wrapped in polymers such as polycarbonate polyurethane, polyethylene, polyimide, polyamide, and modified polyisocyanurate.

Conventional processing techniques may be used to coat thin layers of synthetic material such as PVC (polyvinyl chloride), PC (polycarbonate), PET-G (polyethylene terephthalate glycol-modified) with magnetic powder. Some of these coating processes may include magnetography or electromagnetic brush (EMB) powder coating.

Stackup of a Smart Card

An RFID device or transponder unit, which may for example be smart card or contactless entry card, may have a metal layer or plate on a top surface thereof, which may adversely affect (attenuate, reduce) RF coupling between the smart card and an external reader. Magnetic particles or metal foils may be disposed in or on one or more layers of the smart card to offset the attenuation, enabling the smart card to function better.

FIG. 2A shows an exemplary stackup for a smart card 200 comprising an "electronic laminate" 220 and a metal face plate 210. This may be referred to as a "metal card" (or "metallized smart card"), or variations thereof. Regarding the electronic laminate 220, one or more thin layers of synthetic material (such as PVC, PC, PET, PET-G), such as two layers 222, 224 of synthetic material each having a thickness of approximately 50 µm, may each be coated with magnetic particles 223, 225 (such as 15-30 µm), respectively. When more than one layers are used, they may be pre-laminated in a stack of shielding layers.

The magnetic particles may be wrapped in a polymer matrix allowing for adhesion to the synthetic material during processing. The multiple magnetic-coated layers (or "magnetic layers") may be laminated with a transponder unit (transponder layer) 230 to create the "electronic laminate" 220 which can be joined with a metal plate such as a the metal faceplate 210 of a smart card (or other RFID device), or mounted to a metal surface of a mobile phone.

The magnetic material (particles) for the shielding layer(s) may be deposited to cover the entire surface of the layer(s) of synthetic material, or may be selectively deposited to cover only selected portions of the layer(s) of synthetic material. The magnetic particles may be deposited on (upon) or in (within) the surface of the synthetic material layer(s). The shielding layer 222 shows magnetic particles 223 disposed within a lower (as viewed) surface thereof. The shielding layer 224 shows magnetic particles 225 disposed upon an upper (as viewed) surface thereof. The magnetic particles may be disposed on or in the opposite surfaces of the synthetic layers, including on both sides of the synthetic layers, and may be mixed within the material for the synthetic layers. The magnetic particles may be deposited on the top (as viewed) surface of the transponder unit, or on the bottom (as viewed) surface of the face plate. The term "shielding layer" may refer to a substrate which has had magnetic particles disposed thereon (or therein), and by using selective deposition, a desired pattern of magnetic shielding material may be formed (or printed) onto the shielding layer substrate.

An alternate to selective deposition (or printing) a pattern of magnetic particles on a substrate may be to form shielding layers from a composite material made up of magnetic particles mixed in materials normally used to construct the inlay substrate (or card body) of a smartcard (i.e. PVC, PC etc). This could be by extrusion or calendaring of a melt-mixed composite material. However, in the main, hereinafter, "coating" a layer of synthetic material with magnetic particles may be discussed in exemplary embodiments using shielding layers.

The selective coating of individual layers of synthetic material with magnetic particles, and then hot and cold laminating the layers with the transponder unit to create a composite product without the use of an adhesive layer(s), may result in high magnetic permeability and offsetting of the shielding effect of the metal plate to which the electronic laminate is attached.

The magnetic layers (shielding layers) 222, 224 may significantly improve the reception and transmission performance of the RFID card or tag (transponder unit) in communication with a reader or terminal, achieving a read/write distance compliant with the EMV (Europay, MasterCard, Visa) standard of 4 cm.

The magnetic particles may, for example, be in the form of spheres, beads, flattened flakes, elongated rods, or other geometric shape. In the main, hereinafter, magnetic particles in the form of spheres may be discussed, having an exemplary diameter of approximately 20-30 µm, disposed as one or more layer(s) on an underlying support layer, thereby provide a shielding layer to minimize carrier wave attenuation, which may be particularly beneficial in the context of a contactless smart card having a metalized (or metallic) layer. Because the beads or spheres have a substantially circular cross-section, they can be arranged, substantially tessellating the underlying support layer with minimal gaps between adjacent beads or spheres, thereby minimizing leakage of an electromagnetic field through the layer, while providing better permeability. The beads may be flattened, like discs. The layer of beads may dissipate or resonate an electromagnetic field better than a comparable layer of magnetic flakes (substantially flat, irregularly-shaped particles). The beads may be coated with a low-temperature adhesive which allows the beads to be collated directly onto PVC, via an electromagnetic transfer engine. A layer of flakes may need to be overlapping to obtain shielding performance comparable to that of a layer of beads, and may have a greater overall thickness. In addition, a layer of flakes may not pack as effectively as spherical particles meaning a higher overall thickness of shield material is required.

A Selectively-Deposited Shielding Layer

FIG. 2B illustrates a exemplary shielding layer 240 for a smart card (or contactless entry card) having a metal plate. The shielding layer 240 may be formed as one or more layers of magnetic particles, such as on or in synthetic layers, selectively (rather than covering an entire surface) in areas covering and overlapping (corresponding to, aligned with) at least portions of the booster antenna BA 250 including for example, one or more of the card antenna CA component thereof, the coupler coil CC component thereof and/or the extension antenna EA component thereof, including all of the components (or tracks) of the booster antenna. (The booster antenna is shown only generally, in FIG. 2B. An exemplary booster antenna, and its various components, is shown in greater detail in FIG. 1A.)

The one or more layers of magnetic particles may be selectively deposited on corresponding one or more synthetic layers, then laminated to form a composite layer, as described with respect to FIG. 2A. The shielding material may be selectively disposed over the turns of the booster antenna to shield these portions of the booster antenna from the adverse effects of the metal plate (in a metal smart card). By forming the shielding layer to cover only booster antenna components, rather than an entire surface of the inlay substrate, cost may be reduced and shielding performance may be enhanced.

FIG. 2B is illustrative of selective deposition of a pattern of magnetic material (particles) on a substrate such as PVC, overlying a booster antenna BA of a smart card to offset effects of metal face plate. The pattern corresponds to the turns of the various components of the booster antenna BA. Selectively deposited (patterns) of magnetic material (particles) may also be used as a carrier medium for depositing other materials, such as conductive materials, onto substrates for use (for example) as a booster antenna (BA) or a module antenna (MA).

Different-Size Particles

Magnetic particles of a given shielding layer (or layer on the imaging drum, as discussed below) may have different, substantially non-uniform sizes (such as different diameters, for spherical particles). The diameter distribution of the magnetic particles can be selected to create fractions from the full magnetic particle size distribution. This can be used to improve the packing density of the magnetic spheres, reducing the number of voids in the magnetic coating and thereby improving the shielding performance of the magnetic coating.

FIG. 2C illustrates a layer 200 of magnetic particles on a surface of a substrate 202 (such as the synthetic substrates disclosed herein). In this example, there are two fractions (or portions) of particles, with different and distinct sizes. Relatively smaller sized particles 212 may improve the performance of the magnetic shielding by filling voids between relatively larger sized particles 214. Blends of various size fractions can be prepared with (exhibit) various (selected) ratios, by mass or by volume, in order to optimize the packing of the particles and to prevent leakage of electromagnetic field through the layer of magnetic particles.

Some examples of magnetic coatings having at least two fractions of different size particles may include:
large particles having a size (diameter) of approximately 100 μm+/−50 μm
small particles having a size (diameter) of approximately 30 μm+/−20 μm The large particles may be, on average, approximately 2-3 times larger than the small particles.

The large and small particles may comprise the same or different materials from one another.

Coated Magnetic Particles

The magnetic particles (including a selectively deposited coating thereof) may be coated with a suitable material to facilitate their being fixed in place on the substrate of synthetic material prior to lamination by a number of methods. Partial melting of the substrate before or after disposing (placement of) the magnetic particles can allow the magnetic particles to become at least partially embedded in the substrate.

FIG. 2D shows a coated magnetic particle 240 comprising a "core" magnetic particle 242 and a coating 244 covering the magnetic particle. An exemplary size (diameter) for the magnetic particle may be approximately 100 μm (such as the large particles, described above) or approximately 30 μm (such as the small particles, described above), such as approximately 50 μm. An exemplary thickness for the coating on the magnetic particle may be 1-5 μm, such as approximately 3 μm. The thickness of the coating may be less than approximately 10% of the size (diameter) of the magnetic particle. For magnetic shields comprising two or more sized of magnetic particles, any or all of the particles may be coated. Alternatively, a binder may be applied (such as by spraying) onto the substrate to hold the magnetic particles in place.

The individual magnetic particles may be coated with a variety of polymers or epoxies in order to improve the production of magnetic shielding layers. The presence of a coating layer on the magnetic particles may reduce the mass density of the particles, and thus may improve the flow characteristics of magnetic particles in a cloud of magnetic particles (the formation of a cloud of magnetic particles for coating the imaging drum is discussed with respect to FIG. 6.), in contrast with magnetic particles which are not coated, when the coating is less dense than the magnetic particles. In addition to reducing the mass density, the use of specially selected polymer coatings can generate inter-particle repulsions via tribo-electrostatic charging. The inter-particle repulsions can reduce the resistance to flow of the particles and hence assist the formation of a suitable cloud and coating on the imaging drum.

The coating of the magnetic particles may comprise lubricants, such as Teflon and graphite. The coating may comprise functional materials, such as carbon black, to improve light and heat absorption by the coated magnetic particle. The coated particles may be exposed to a high intensity flash of light in order to partially or fully melt the polymer coating and thereby fix the coated magnetic particles to the substrate, as well as to each other.

The substrate may be transparent to light enabling the exposure of both sides of the coated magnetic particles to the flash of light. Alternatively, a laser can be used to melt the polymer coating and fix all or part of the magnetic particles to the substrate. The fusing process can also be achieved using a blast of hot air or applying radiant heat from a halogen discharge lamp or similar. Any suitable heat source may be used.

The use of specially chosen polymer or epoxy coatings facilitates the smoothing of the surface of the magnetic particle coating on the final substrate and can improve the performance of subsequent lamination—i.e. the polymer or epoxy strengthens the bonding of the magnetic shield layer(s) to other layers in the device structure.

A polymer or resin coating on the magnetic particles may contain other chemicals or nanoparticles. The magnetic particles may be coated in a polymer resin that contains a plurality of other particles. The magnetic particle may act as a carrier for the resin and other particles, for example nanoparticles. The chemicals or other particles (functional material) can be contained within the resin or attached via chemical bonds to the surface of the resin. Alternatively, the functional materials can be directly attached to the magnetic particles by physical or chemical means. In this manner, the magnetic particle can act as a carrier for another functional material. For example the functional material could be a pigment, amorphous crystalline powder or nanoparticle. The particles embedded in the resin can be, for example, tungsten, copper, iron, copper oxide of any shape and having a size (diameter or cross-dimension) typically less than 20 μm. The particles together with resin and carrier particle may form a conglomerate of material that can be moved and placed by selective placement on a magnetized drum and electrostatic transfer to a substrate.

Functional materials (as maybe be referred to herein) can have a wide variety of uses in a smart cards or other secure documents. The functional materials could be color pigments or dies, thereby changing the color of the magnetic bead(s) and allowing graphic patterns to be printed. These deposited patterns could have dual functionality by (i) forming logos or designs and (ii) acting as a shielding from metal components in a credit card or secure document, thereby enhancing the communication performance of the product (such as smart cards).

The magnetic particles can be coated with a coating of polymer or resin comprising one or more constituents, for example: polyethylene, polyester, polystyrene, polyvinylidenefluoride, silicone, polyimide, polyamide, styrene methacrylates, acrylic acid. The coating can be softened or melted by exposing the deposited magnetic material to heat (e.g. from a halogen lamp, infrared lamp, hot air blast) or an intense flash of light, such as from a high power xenon lamp, or any other suitable heat source. Alternatively, the particles may be heated by the application of microwave radiation. The polymer or resin coating will then soften or flow and bind to adjacent magnetic beads and the substrate, thus fixing the magnetic beads on the substrate after deposition.

FIG. 2E shows a powder 260 comprising a magnetic material (such as a particle) 262 acting as a carrier for other particles 264. A magnetic shield may comprise a "magnetic powder", which may refer to coated magnetic particles that also carry other species. The material comes in the form of a powder that is magnetic (i.e. like magnetic toner). The magnetic shield may comprise magnetic particles, coated magnetic particles, functionalized (functionalised) magnetic particles, and magnetic powders.

FIG. 2F shows a conglomerate 280 comprising a magnetic particle 282 in a resin 286 having other particles 284. A conglomerate comprising a plurality of magnetic carrier particles and metal or nanoparticles embedded in a resin may be used, instead of a single type of magnetic carrier particle. A fusing process can be used to create intimate contact between particles and allow electrical current to flow between metal particles. Such a process can be used to fabricate electronic circuits, including traces (conductive lines, turns, tracks) for antenna structures (such as a booster antenna BA or a module antenna MA).

The conglomerate of material can be deposited in a controlled manner in various parts of a card or secure document. Using the magnetic particles as a carrier for other materials may require a smaller particle size distribution for the magnetic particles, such as in the range 5-20 μm. The conglomerate can be fixed to a substrate by melting the resin coating using direct heating or by use of a high intensity xenon flash lamp.

Magnetography and Ferrography

Magnetography and ferrography are methods for printing letters, numbers, and other images on ordinary paper using magnetic particles. Generally, magnetic particles are attracted to a drum having a surface that may be selectively magnetized (some areas magnetized, others not magnetized), then electrostatically charged, then transferred to a substrate. Magnetography is mentioned herein as exemplary of any technology using magnetic particles to "print" an image of magnetic particles from a drum onto a substrate (for example, for depositing toner and pigments on paper substrates for the printing industry), including electromagnetic brush technology, xerography, and the like.

FIG. 3 is a diagram illustrating, generally, how a magnetography system 300 may operate. Magnetic particles (black dots), which may be referred to as "toner particles" are dispensed from a reservoir onto a toner roller 310 which may rotate clockwise (CW). These magnetic particles may be dispensed intermittently (rather than continuously) onto the toner roller, and are then transferred to a dielectric cylinder or imaging drum 320 which may rotate counterclockwise (CCW). A number of separate areas 322 of transferred toner particles are shown on the surface of the drum.

An electrostatic charging device 330 imparts an electrostatic charge to the toner particles 322 on the imaging drum 320, as they pass by. Then the charged particles 322 come into close proximity with a paper substrate 350 and are attracted, transferred and attached to a top (as viewed) surface thereof. A pressure roller 360 disposed on the opposite side of the paper substrate maintains pressure and may be electrostatically charged to attract the charged particles 322 from the imaging drum 320 onto the surface of the paper substrate 350. Excess particles which have not been transferred to the paper substrate may be removed from the drum by a scraper.

Electromagnetic brush technology (EMB) is similar to processes generally used in copiers and laser printers. The EMB process uses powder particles mixed with carrier particles. The carrier particles may simply be particles with an iron core coated with an insulating layer. The mixing process causes the powder particles to become tribo-electrostatically charged against the carrier particles. Numerous powder particles may connect (attach) to one carrier particle. This combination is called a "development system". These development systems are guided along a rotating drum containing magnets on a fixed static position, forming a magnetic brush on the drum. This brush on the rotating drum is then cut to the right proportion by a doctor blade. When this brush comes along the electrically charged substrate, the powder particles from the development system move to the substrate by electric force (electrostatic attraction). The carrier particles remain on the drum by magnetic force, and then float freely back to the mixing system to reconnect to new powder particles.

In powder coating a flexible substrate, such as with EMB, the substrate may be directly guided along the brush over a substrate drum. In powder coating an inflexible substrate or conductive ferromagnetic material, the powder may be transferred via a semi-conductive transfer drum to the substrate by a different level of electrostatic fields between brush drum, transfer drum, and substrate. For example, 1500 volts (V) on the brush drum, 500V on the transfer drum, and zero V on the substrate.

Creating a Magnetic Shield (for Transfer to a Substrate)

FIGS. 4A,B,C illustrated a process of creating a film (thin layer, coating) of magnetic particles, on an imaging drum, for subsequent deposition (transferring, printing) as a patterned layer of particles on a substrate, such as for use as a shielding layer (see, e.g., FIG. 2B).

Generally, the film may be created on a drum, such as a magnetography (imaging) drum (of the type shown in FIG. 3), having a surface which may be magnetized ("recorded") to attract the magnetic particles which will attach thereto, forming a film of magnetic particles on the drum. The drum may be cylindrical, having a circular cross-section, and may be rotatable. It should be understood that the drum may take other forms, such as a conveyor belt having at least one semi-cylindrical end where transfer of particles from the imaging drum to the substrate may occur.

Generally, as the drum rotates, the substrate advances past a circumferential portion of the drum, and the magnetic particles on the drum may be electrostatically attracted to the substrate and be substantially entirely transferred from the drum to the substrate (some particles may elude transfer, and remain on the drum).

Selected areas (regions, portions, zones) of the drum surface may be magnetized with different intensities (magnetic strengths). These magnetized areas may be referred to herein as "recorded zones". The size and separation of the recorded zones may be dependent on (related to) the size and layout of a magnetic writing head used to magnetize (record) the zones, as well as the current and frequency used in the writing process. Typically, the recorded zones may have a size of approximately 20 µm-40 µm (across), and may be of a suitable geometric shape (such as squares, circles, triangles, trapezoids, hexagons, including combinations thereof) to substantially cover (or tessellate) the entire surface (or portion thereof) of the drum being used to create the magnetic film.

Selected ones of the recorded zones, or a series or group of recorded zones on the magnetic drum, may be magnetized to a greater or lesser extent than other ones of the recorded zones. Some of the zones may remain unrecorded (not magnetized), but may nevertheless be referred to herein as "recorded zones". Recorded zones having different magnetic strengths may be used to selectively coat areas of the magnetic drum with magnetic particles of different sizes. The zones may be analogized to image pixels. In the main, hereinafter, recorded zones which are magnetized to one of two different strengths will be discussed.

By selectively magnetizing recorded zones, a magnetic film may be created having a desired pattern, such as a pattern corresponding to at least a portion of a booster antenna BA (including selected components thereof) of a smart card. This magnetic film may then be transferred to (printed upon) a suitable substrate for use in an electronic laminate (see, e.g., FIG. 2A).

FIG. 4A illustrates a grid (or array) 400 of recorded zones 410 and 420 having at least two different magnetic strengths. For illustrative purposes, dark (shaded) squares represent relatively high magnetic strength areas 410 (recorded zones) and white (not shaded) squares represent relatively low magnetic strength areas 420 (recorded zones). The recorded zones need not be limited to one of two magnetic strengths, a number of distinct strengths or a range of strengths can be used, for clarity only two (high and low) strengths are discussed here. The size of the individual recorded zones may be approximately 40 µm. The strength of the relatively high magnetic strength areas may be at least twice (2×) that of the relatively low magnetic strength areas, such as 3-10 times higher.

FIG. 4B illustrates that the magnetic strength of the high magnetic strength zones 410 may be such that only magnetic particles 412 up to a certain mass (equivalently diameter) will be able to overcome gravity (and centrifugal force) and become (and remain) attached to the imaging drum. Following recording of the zones, magnetic particles of a particular range of sizes may be brought into close proximity with the drum. These magnetic particles may selectively attach only to the high magnetic strength zones (shown as dark squares) on the drum.

After attachment of the first set of relatively massive magnetic particles 410 to the drum, a second set of magnetic particles 422 with a smaller range of sizes (namely, less massive than the first set of magnetic particles) may be brought into close proximity with the imaging drum. These smaller magnetic particles may be attracted and become attached to the recorded zones 420 having lower magnetic field strength. The more massive particles may be referred to as "relatively large" particles, and the less massive particles may be referred to as "relatively small" particles.

FIG. 4C illustrates an exemplary film (or "assembly", or "structure", or "array") of large and small magnetic particles. This film of magnetic spheres, having different sizes, can then be transferred to a substrate by the methods described herein (electrostatic transfer, or adhesive substrate, etc.), forming a selective deposition of magnetic material on the substrate.

The method disclosed herein of arranging magnetic particles of different sizes (or masses), in a controlled manner, on the drum prior to transferring to the substrate, may enhance the packing density of a resulting film of magnetic particles on the substrate (shielding layer), thereby reducing gaps between particles and improving the performance of a shielding layer in a smart card (for example) and improving the communication (transfer of signals) and power (energy harvesting) between the smart card and the reader. The method may be applicable to non-spherical ferrite or magnetic materials such as ellipsoidal shaped particles or flakes.

Particle Size Distribution

The magnetic coating on the shielding layer (and the drum) may comprise selected distributions of particle sizes. Normally, a manufactured batch of magnetic particles contains a distribution of particle sizes, a statistical count of particle sizes typically generates a bell-shaped or Gaussian curve. Such a distribution may be substantially altered by size excluding either end of the distribution, i.e. selectively isolating and removing the largest or smallest particles by mechanical methods such as screen filtering or centrifugation. This can result in a specially selected distribution of particle sizes such that the size of particles is optimized for a given application; the particle size being important for obtaining a given shielding performance at certain frequencies and also influencing the flow-ability of the magnetic particles in the magnetic particle coating system. In addition, more than one distribution of magnetic particle size may be combined in order to tune the performance of the coating system and the electromagnetic characteristics of the final magnetic shield layer.

Magnetic Shields

A magnetic shield comprising magnetic particles may be formed on (or transferred to, or selectively deposited onto) a substrate for use as a shielding layer, and may be patterned to cover at least selected portions of a booster antenna BA, so that (for example) attenuation effects of a metal face plate may be alleviated.

FIG. 5A illustrates an embodiment of a magnetic shield 500A formed on (or transferred to) a substrate 550 (compare 350). In this example, magnetic particles 510 may be disposed as a coating on the (synthetic) substrate 550 along with "other particles" 512 such as, but not limited to a binding agent (they may be lubricants, metal particles, etc.). As illustrated, the magnetic particles 510 may be "sandwiched" between two layers of the other particles 512 which are disposed both above and below the magnetic particles 510.

The other particles (of the binding agent) may be of any suitable size and shape, and may comprise materials such as polymers or resins. As an example, the other particles may comprise polyethylene, having a diameter (or cross-dimension) of approximately 200 nm. The other particles may be deposited, for example, by ultrasonic spray coating or electrostatic transfer before and/or after transfer of the magnetic particles onto the substrate from the magnetized drum. The other particles may function as a binding agent for the magnetic particles, improving the adhesion of the magnetic particles to the substrate and fixing transferred patterns of magnetic particles to the substrate.

After being applied to the substrate, the binding agent may be melted by application of a high intensity flash of light to the coated substrate, for example from a xenon flash lamp, or by direct heating of the coated material. The binding agent may comprise a variety of other components that add functionality to the magnetic coating. For example, the binding agent may contain pigments or dies that add color to the deposited magnetic coating. Alternatively the binding agent may comprise nanoparticles with magnetic properties which enhance the shielding performance of the magnetic coating. The binding agent may contain small particles of magnetic material, comprising small magnetic particles or spheres coated in a given polymer or resin. In this case the binding agent can be applied by a dispenser to the magnetized drum and deposited on the substrate. In a second deposition cycle the magnetic particles can then be applied to the magnetized drum via a second dispenser and then transferred on top of the binding agent. A third layer comprising of binding agent could then be transferred on top of the magnetic material in a third deposition cycle, resulting in a layered "sandwich" structure, as shown.

Forming a "Sandwiched" Magnetic Shield on the Drum

FIG. 5B illustrates an embodiment of a coating 500B for a magnetic shield formed on an imaging drum 520 (compare 320), rather than on the substrate. As in the previous example (FIG. 5A), magnetic particles 510 may be "sandwiched" between the other particles 512 (such as a binding agent) which are disposed both above and below the magnetic particles.

The binding agent may comprise a variety of materials including, for example, polymers and resins along with one or more particles of a magnetic material (e.g. magnetite or ferrite) to enable attachment to the recorded zones on the magnetized drum. The layered structure on the drum shown in FIG. 5B can be created as a plurality of layers of different materials, and some or all of the layers may comprise magnetic materials or ferrite particles. The entire layered stack can then be electro-statically charged and transferred to a substrate with the aid of an opposite charge either on the substrate or behind the substrate.

Low coercivity magnetic particles (coercivity refers to the resistance of a ferromagnetic material to becoming demagnetized) may be used as agents that increase the mass of a credit card (including smart card) or ID card body. A substrate commonly used in the construction of a credit cards such as PVC, PET or PC can be coated with particles of higher density then the substrate material in order to increase the weight of the substrate (hence, the card). These particles may comprise a variety of materials including metals or metal alloys. Single or multiple layers of the substrate can be then be laminated to form a credit card body with mass greater than that possible by using traditional substrate materials alone.

Magnetic particles or ferrite particles (such as having a spherical shape) of sizes less than approximately 100 μm can be placed on a magnetized drum in specific (selected) areas and transferred by means of physical adhesion or electrostatic attraction to the substrate. These particles may comprise ferrite (e.g. $Fe_3O_4$), iron oxide-based alloys or iron-based alloys (e.g. FeSiAl) or other para-magnetic materials, and may be spherical in shape. The particles can be deposited in specific areas (portions) of the card body, avoiding other areas such as the area traditionally milled out for insertion of the chip module (or antenna module AM).

Deposition of Nanoparticles or Nanowires

Magnetic particles such as ferrite or ferrite alloys, in the form of spheres or flakes for example, can be used as carrier particles to deposit (deliver) nanoparticles or nanowires, such as conductive nanoparticles and nanowires, in a controlled manner, to selected portions of a substrate, including forming patterns of conductive nanoparticles or nanowires which may be used as antennas and components thereof on the substrate. Some examples of forming networks of nanoparticles or nanowires may be discussed below, with respect to FIGS. 14A-14C.

The nanoparticles or nanowires can be dispersed in a variety of liquid-phase media, for example solvents. The nanoparticles or nanowires can be coated with a polymer to assist their dispersion in the liquid medium. A chemically similar polymer coating can be applied to the magnetic particles. When dispersed in a liquid medium the nanoparticles or nanowires may weakly adsorb onto the surface of the magnetic particles. The magnetic particles carrying the nanowires or nanoparticles may form a conglomerate, as discussed previously. The conglomerate may comprise a blend of polymers and a plurality of small magnetic particles, resulting in an exemplary overall particle size in the range of 10-150 μm. The conglomerate may be moved onto the drum under the influence of an externally applied magnetic field.

In an exemplary implementation, the carrier particles with polymer coating may be dispersed in a liquid along with coated nanoparticles or coated nanowires. The liquid medium may be brought into close proximity or contact with a magnetic surface (of the drum) having a pattern of magnetized areas ("recorded zones"), as described for example with respect to FIG. 4A. The recorded zones may attract the carrier particles. The carrier particles (i) may have formed conglomerates through weak adsorption of nanoparticles or nanowires in the liquid phase or (ii) can drag the nanoparticles or nanowires out of the liquid solution as they are drawn from the liquid by the externally applied magnetic field. Either of these processes may result in the coating of the magnetized areas (recorded zones) of the magnetic surface (of the drum) with particles of the conglomerate. The conglomerate can then be electro-statically charged while attached to magnetic surface (of the drum).

A substrate having an electrostatic charge opposite to that of to the conglomerate, or having a material with an opposite charge directly behind it, can be brought into close proximity or contact with the magnetic surface of the drum. The electrostatic potential can draw the nanoparticles or nanowires from the conglomerate onto the substrate. If the carrier particles are sufficiently large (for example, greater than 150 μm), the carrier particles will tend to stay fixed in place on the magnetic surface and can be recovered and re-used for subsequent coating operations—this is due to the electrostatic potential generating insufficient force to move the entire mass of the conglomerate. If the carrier particles are less than a particular size (for example, less than 150 μm), substantially the entire conglomerate may be transferred to the substrate. This technique could be to deposit colored (coloured) coatings, electroluminescent material, dyes, fluorescent material, for example. Using magnetic particles with magnetography to carry other useful materials to locations on a substrate.

Selective Deposition of a Pattern of Magnetic Particles on a Substrate

FIGS. 4A,B,C showed an example of magnetizing ("recording") selected areas ("recorded zones") of a magnetic drum for selectively attracting magnetic particles to the surface of the drum. Some techniques (methods and apparatus) will now be described for effectively coating selected magnetized areas (recorded zones) of a magnetic drum, which may also be referred to as an "imaging drum".

FIG. 6 shows a system 600 (compare 300) for selectively depositing (applying patterns of) particles (such as magnetic particles) on (to) a substrate, a process which may be referred to herein as "selective deposition", such as to form, for example, a shielding layer having magnetic particles in a pattern corresponding to a booster antenna BA, such as shown in FIG. 2B. The system 60 may utilize some of the elements described with respect to the system 300 of FIG. 3. The system may deposit magnetic particles onto a substrate, or may use magnetic particles as carrier particles for selectively depositing other particles (such as nanoparticles), onto a substrate.

The system 600 may comprise a magnetic particle reservoir, a (magnetic) transfer roller 610 (compare 310). a deflector blade 670, a (magnetic) imaging drum 620 (compare 320) an electrostatic charging unit 630 (compare 330), a scraper, and a control system 602 Some exemplary relative orientations of various elements of the system may be described in terms of positions of the clock ("o'clock positions"). Additionally, terms such as "upstream" and "downstream" may be used to indicate the relative positions of items or elements, the term upstream generally indicating coming before, the term downstream generally indicating coming after.

The magnetic particle reservoir dispenses magnetic particles (shown as black dots) onto the transfer roller 610, such as at the "9 o'clock" position of the transfer roller 610. The transfer roller 610 may rotate in a clockwise (CW) direction. The release of magnetic particles onto the transfer roller may be intermittent (turned "on" and "off"), such as for process control.

The transfer roller 610 may be located at approximately the "10 o'clock" position of the imaging drum 620, and spaced a small distance therefrom. In this example, the imaging drum 620 is shown rotating in the counter-clockwise (CCW) direction, and the transfer roller is shown rotating in the clockwise (CW) direction, or in a direction opposite to that of the imaging drum. The transfer roller carries magnetic particles which will be transferred to the imaging drum, and may be replaced by a brush.

The transfer roller 610 may be disposed closely adjacent to a magnetized (magnetized) imaging drum 620. For example, the "5 o'clock" position of the transfer roller 610 may be closely adjacent the "10 o'clock" position of the imaging drum 620. This may correspond to the closest position of the external surface of the transfer roller 610 and the external surface of the imaging drum 620, and is downstream of the deflector blade 670. (The deflector blade 670 is disposed u upstream of the transfer roller 610.) The imaging drum may rotate in a counter-clockwise (CCW) direction opposite to the CW direction of rotation of the transfer roller.

The deflector blade 670 may be positioned at approximately the "3 o'clock" position of the transfer roller 610 "downstream" of the reservoir. The purpose of the deflector blade 670 is to cause magnetic particles to be released from the surface of the transfer roller into a "cloud" (or suspension) 680 of magnetic particles which are closely adjacent the magnetized surface of the imaging drum 620, and moving generally in the same direction as the surface of the imaging drum 620, for being attracted to and attaching themselves to the recorded zones (refer to FIGS. 4A-4C) on the imaging drum 620, so that there will be a pattern or coated image 622 (compare 322) of magnetic particles on the surface of the imaging drum 620. Note that the deflector blade 670 and cloud 680 of magnetic particles is slightly upstream of the transfer roller 610, such as at the "11 o'clock" position of the imaging drum 620. The deflector blade may be generally triangular in cross section. FIGS. 7A-7F show various configurations for deflector blades.

Generally, the cloud 680 of magnetic particles may be created by displacing the material generally in the same direction as the movement of the imaging drum 620. The deflector blade 670 can be used to scrape material from the rotating magnetized transfer roller 610 to displace the magnetic particles and create a cloud 680. Where the cloud 680 of displaced magnetic particles travels in the same direction (CW) as the magnetic transfer roller 610, the imaging drum 620 can rotate in a counter direction (CCW) such that the direction of travel of the imaging drum 620 and cloud 680 are the same at the interface of the imaging drum 620 and cloud 680. Movement of the cloud 680 of magnetic particles in the same direction as the imaging drum 620 may reduce the force exerted by particles within the cloud on 680 particles already adhering to the magnetized regions of the recording drum 620, thereby improving the particle transfer from the cloud 680 to the imaging drum 620 and improving the quality (and coverage) of the coated image 622 coverage on the imaging drum 620.

A pattern (coated image) of magnetic particles 622 is shown on the external surface of the imaging drum 620. This pattern of magnetic particles will be transferred to the substrate 650 (compare 350)

The electrostatic charging unit 630 (compare 330) may be disposed closely adjacent to the imaging drum 620, downstream of the transfer roller 610 and deflector blade 670 but before the substrate 650 such as at the "9 o'clock" position of the imaging drum 620. The purpose of the electrostatic charging unit 630 is to impart a charge (such as a negative charge) to the magnetic particles.

The substrate 650 may be disposed below the imaging drum, downstream of the electrostatic charging unit, and be oriented horizontally (as shown), so that is closest to the "6 o'clock" position of the imaging drum. A charged (such as positively charged) pressure roller 660 (compare 360) may be disposed below the substrate 650, to urge the substrate 650 against the imaging drum 620 The pressure roller 660 may rotate in a clockwise (CW) direction, opposite to the CCW direction of rotation of the imaging drum 620.

As the imaging drum 620 and the pressure roller 660 rotate, the substrate 650 is fed through a narrow gap between the imaging drum 620 and the pressure roller 660 (from left to right, as viewed, in this example). As the substrate 650 is fed through the gap between the imaging drum 620 and the pressure roller 660, the pattern of magnetic particles on the surface of the imaging drum 620 will be transferred to the substrate 650. In this regard, the pressure roller 660, in conjunction with the appropriate electrostatic charges, may constitute a means for transferring particles from the imaging drum to the substrate.

The scraper may be disposed at the "3 o'clock" position of the imaging drum, downstream (with respect to the rotation of the imaging drum 620) of the substrate, but before the transfer roller 610, to remove excess magnetic particles from the surface of the imaging drum 620 so that a new pattern of magnetic particles may be applied thereto. The excess magnetic particles may drop into a container, and may be reused.

A control system 602 may be provided to control one or more of the rotational speeds of the transfer roller 610, imaging drum 620 and pressure roller 660, and also to control the dispensing of magnetic particles from the reservoir onto the transfer roller 610. The thickness of magnetic particles on the substrate 650, and the quality of the image of the pattern of particles on the substrate 650 may be monitored by suitable sensors, and various parameters may be adjusted, by the control system 602, to achieve a desired thickness and image quality.

In this manner, an "image" or pattern of magnetic particles may be selectively deposited (or printed) onto a surface of a substrate 650, such as for forming a shielding layer for use with or within an RFID device.

The surface of the substrate 650 may be textured, or otherwise prepared (knurled, roughened, provided with ridge, cross-hatches, grooves and the like) to improve fixing of particles which are selectively deposited thereon. The substrate may be heated (partially melted), either before or after receiving the particles, to improve their adhesion thereto.

In an exemplary use scenario, magnetic particles may be adhered to the recorded zones of the imaging drum 620, resulting in a pattern (or "image") of magnetic particles which may be transferred ("printed") to a substrate such as for making a shielding layer for a smart card.

In another exemplary use scenario, relatively large magnetic particles (such as approximately 100 µm or greater in size) may be electro-statically charged and used as a carrier medium for relatively small metal particles (such as approximately 20 µm or less in size) or nanoparticles. In this scenario, the techniques disclosed herein may differ from xerography in that xerography uses a drum fully coated in magnetic carrier that is electrostatically charged then selectively discharged by light. The pigment adheres to the charged regions and is then transferred to the substrate. In the magnetography-based techniques disclosed herein, the magnetic recorded pattern on the magnetic imaging drum dictates the pattern, the magnetic carrier particles plus the smaller particles are transferred to the recorded regions and then the small particles only are transferred to the substrate.

The smaller metal particles or nanoparticles may have sizes such that their mass enables them to be moved under the influence of an electrostatic field. Larger magnetic iron-oxide based alloys or other magnetic particles may be used as carrier particles (and may be referred to as "carrier particles") for the smaller metal particles or nanoparticles.

The larger carrier particles (magnetic material) may be selectively placed (disposed) on a magnetic drum (having patterned recorded zones for attracting/receiving the larger magnetic particles, and they may be electro-statically charged (such as with a negative charge) by means of a corona.

The smaller metal particles, which may be nanoparticles, may be electrostatically charged the same as the larger carrier particles, but opposite to that of the substrate. The smaller metal particles may then be attracted to the larger carrier particles, and thereby will adhere to and tend to coat (cover) the larger carrier particles. The smaller metal particles or nanoparticles may be referred to as "coating particles".

The carrier particles (which are magnetically attracted to the drum) covered in coating particles (which are electrostatically attracted to the carrier particles on the drum) may then be brought into close proximity or contact with a substrate which is electrostatically charged (such as with a negative charge) oppositely from the coating particles, sufficiently to cause the (positively charged) coating particles to be attracted away from (drawn off of) the (positively charged) carrier particles and onto the substrate, to form a layer of coating particles on the substrate.

The mass of the carrier particles may be such that they may not be dislodged (moved) during this process, rather remaining substantially securely in place on the magnetized drum so that they may be recycled (re-used) in future deposition runs, including first stripping the carrier particles from the drum and re-depositing them on the drum.

The carrier particles and/or coating particles may each (both) have a polymer or resin coating to facilitate the electrostatic charging of the particles and the transfer of the coating particles to the substrate. The carrier particles may be magnetic. The coating particles may be non-magnetic. The substrate may be non-magnetic.

In a manner similar to how an image of magnetic particles may be disposed (printed) onto a substrate, an image of magnetic particles on the imaging drum may be used to create a pattern of binding agent on the imaging drum. Subsequently, the pattern of binding agent may be transferred to a substrate, such as in conjunction with forming conductive tracks (traces, turns) of nanoparticles or nanowires for use as an antenna structure on the substrate, such as may be described hereinbelow with respect to FIGS. 14A-14C.

Deflector Blade

The coating of particles on the drum may be performed by creating a cloud (or quantity of magnetic particles floating in the air) of coated or uncoated particles containing magnetic material in a region adjacent to the recorded surface of the imaging drum so that the magnetic particles in the cloud may be attracted to and adhere to the recorded zones, later to be transferred to the substrate or used for selectively creating a pattern of binding agent on the drum.

FIG. 6A shows, very generally, that the deflector blade 670 used to generate the cloud of magnetic particles may be elongated, and generally triangular in shape (cross-section), having three surfaces (sides) and three edges (at the apexes or intersections of the surfaces/sides). Two of the three surfaces are primarily involved in the removal of magnetic particles from the transfer roller and creation of the cloud of magnetic particles. FIGS. 7A-7F show some exemplary profiles and configurations for the deflector blade in somewhat greater detail.

The imaging drum (A) may rotate in generally the same direction as the direction of the cloud, to reduce pressure at the drum surface. The cloud of particles (black dots) is shown (as indicated by the curved, dashed line arrow) flowing around the deflector blade 670, and onto the surface of the imaging drum 620, where they will be attracted to recorded zones.

FIG. 6B shows (A) the magnetic imaging drum 620, (B) the magnetic transfer roller 610, and (C) a magnetic retouch roller (C) 615, and also shows the deflector blade positioned between (B) the magnetic transfer roller and (A) the magnetic imaging drum. The retouch roller (C) may be used to clean the image from the imaging drum, remove material from the unmagnetised (unmagnetised) parts of the drum and to control the thickness of the recorded pattern.

The directions of rotation of the drum and rollers may be controlled, as follows
  a first direction, such as counterclockwise (CCW), for (B) the magnetic transfer roller 610
  a second direction, such as clockwise (CW), for the magnetic imaging drum (A) 620, which is opposite to the direction of rotation of the magnetic transfer roller (B)
  in either the clockwise (CW) or counterclockwise (CCW) direction for the magnetic retouch roller (C) 615.

The rotational speeds of the drum and rollers may be controlled, as follows
  a first rotational speed, such as 10 rpm for the magnetic imaging drum (A) 620
  a second rotational speed, such as 40 rpm for the magnetic transfer roller (B) 610
  a third rotational speed, such as 50 rpm for the magnetic retouch roller (C) 615

Deflector Blade Profiles

FIGS. 7A-7E present some exemplary profiles (cross-sections) for deflector blades. A basic profile for a deflector blade may be triangular, having three sides (surfaces), three vertices (or apexes, which may be referred to as edges) and three (interior) angles. The two sides of a triangle which form a particular vertex may be referred to as adjacent to that angle. Similarly, the two vertices of a triangle to which a particular side contributes may be referred to as adjacent to that side.

One the three edges (vertices, apexes) of the deflector blade may be referred to as the "leading edge" LE, and may be the edge (vertex) closest to, such as coming into contact with (striking), the particles on the transfer roller. As the transfer roller turns, the leading edge of the deflector blade separates (cuts) the particles from the transfer roller, causing them to form a cloud of particles near the surface of the imaging drum, so that the particles may be attracted to and adhere to recorded zones of the imaging drum. The cloud may be slightly "upstream" (with respect to the imaging drum) of the transfer roller and the deflector blade, such as at the "11:30 o'clock" position of the imaging drum. The cloud may move in the same direction as the surface of the imaging drum.

Another of the three edges (vertices) of the deflector blade may be referred to as the "trailing edge" TE, and is the edge of the deflector blade nearest the surface of the imaging drum (on the "upstream" side of the imaging drum).

The shapes of the leading edge LE and trailing edge TE of the deflector blade may be important to effective formation of the cloud of magnetic particles in the vicinity of the imaging drum. Some variations of the leading and upper edges of the deflector blade are discussed herein.

The side (surface) of the deflector blade between the leading edge LE and the trailing edge TE vertices of the deflector blade, may be referred to as the "upstream surface" US of the deflector blade. Generally, the cloud of magnetic particles will flow along (pass by) the upstream surface US of the deflector blade, and its profile (geometry, surface finish and irregularities) may also be important to effective formation of the cloud of magnetic particles in the vicinity of the imaging drum. Some variations of the upstream surfaces of the deflector blade are discussed herein.

The remaining one of the three edges (vertices) of the deflector blade may be referred to as the "downstream edge" DE, and is the edge of the deflector blade also near the imaging drum, on the downstream side of the deflector blade. The shape of the downstream edge DE may be less important than the shapes of the leading edge LE and trailing edge TE in cloud formation. The surface (side) of the deflector blade between the leading edge LE and downstream edge DE, may be referred to as the "downstream surface" DS, and may be less important than the profile of the upstream surface US in cloud formation.

Either or both of the leading edge LE and trailing edge TE of the deflector blade may be straight (like a knife edge), or may have non-straight shapes. Namely, the profiles can, for example, be serrated with various pitch and length of serrations. The edge profiles can also be wave-like in shape. The edges may be substantially rounded, tapered or bevelled. These different edge shapes can be used to adjust the flow of material running onto the upstream surface US of the deflector blade. Controlling the flow of magnetic particles along the upstream surface US may be important when using compositions of magnetic material containing very small particles where the flow of the particles may be reduced (the apparent viscosity of the magnetic powder is high). The use of tailored blade edges can improve the cutting of magnetic material from the transfer roller and thereby improve the quality of the cloud formed.

The shape of the deflector blade used to generate the cloud of magnetic particles may be tailored to control formation of the cloud. The magnetic powder flows over the upstream surface US of the deflector blade before breaking contact with the blade and being dispersed to form a cloud. The deflector blade's surfaces may be normally smooth and flat. The use of non-flat, substantially curved or non-smooth blade surfaces may affect the flow of the magnetic powder over the deflector blade and may change the shape and density of the cloud which is formed.

FIGS. 7A-7F are cross-sectional views showing some different deflector blade shapes. The orientation of the deflector blades in these views is different than their orientation in previous views.

Figure 7A:
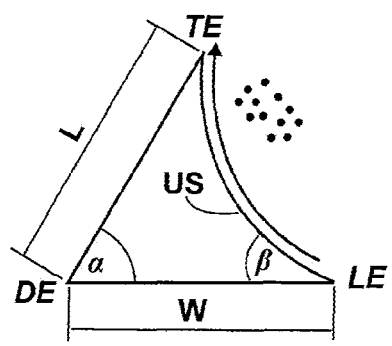

FIG. 7A shows a deflector blade (670) comprising an upstream surface US with a concave surface shape. The upstream side (or surface) US impacts the flow of magnetic particles. The curved arrow illustrates the dominant flow direction of the magnetic particles (or powder) over the upstream side US of the deflector blade (670), from the leading edge LE to the trailing edge TE thereof.

The surface between the leading edge LE and the downstream edge DE may be flat, and may have a dimension W in the range of 5-15 mm. The surface between the downstream edge DE and the trailing edge TE may be flat, and may have a dimension L in the range of 5-15 mm. The upstream surface US is curved (concave), and may be longer or shorter than L and/or W. An angle $\alpha$ is formed at the downstream edge DE of the deflector blade. An angle $\beta$ is formed at the leading edge LE of the deflector blade. The angles $\alpha$ and $\beta$ may each be in the range of 30° to 80°.

Figure 7B:
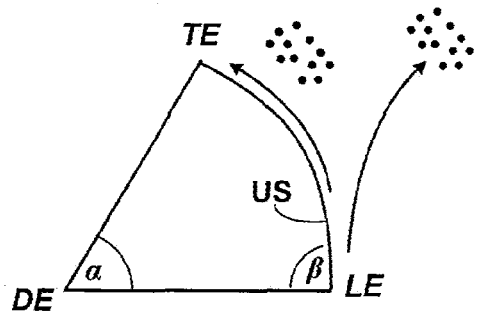

FIG. 7B shows a deflector blade (670) comprising an upstream surface US with a convex shape. In this case the angle $\beta$ may be greater than 60° and facilitate a reversal in direction of some or all of the flow of the magnetic particles, thereby generating a cloud of particles moving in the opposite direction to the transfer roller (610).

Figure 7C:
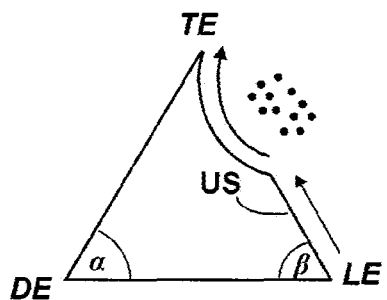

FIG. 7C illustrates a deflector blade (670) design in which a portion of the a upstream surface US surface near the trailing edge TE may be curved, in this case concave, the remainder of the upstream surface US remaining flat.

Figure 7D:
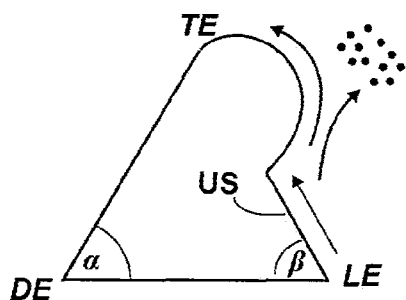

FIG. 7D illustrates a deflector blade (670) design in which part of a portion of the a upstream surface US surface near the trailing edge TE may be curved, in this case convex with respect to the equivalent flat edge, the remainder of the upstream surface US remaining flat.

Figure 7E:
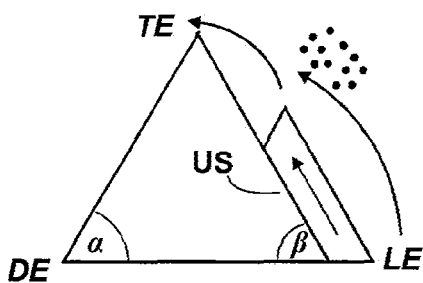

FIG. 7E illustrates a "unibody" deflector blade (670) design, the cross-section of which can be interpreted as being formed by two intersecting triangles. This design creates two consecutive sharp edges or peaks to disrupt the flow of magnetic powder over the deflector blade. The first edge contributes to breaking up the powder before formation of the cloud, assisting the formation of a fine cloud of particles. The resulting flow of particles over the deflector blade can be described as turbulent, which aids the formation of a diffuse cloud of particles. The design shown in FIG. 7E is representative, the concept can include multiple peaks formed from multiple equivalent intersecting triangles. The presence of multiple sharp edges on the deflector blade can be used to slow the speed of the powder flowing over them, thereby compensating for a fast particle flow when using a high transfer roller speed.

Figure 7F:
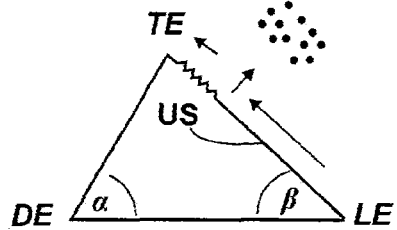

FIG. 7F illustrates an extension of the concept described with respect to FIG. 7E, showing a deflector blade (670) having multiple peaks.

The deflector blade (670) may have non-smooth or textured surfaces (sides), particularly the upstream surface US, to affect (including control, including increase) the flow of particles over the blade. For example, a knurled, dimpled or pitted surface may introduce localized disruption to the flow of magnetic particles over the blade surface, which may generate turbulence to break up of particle flow and thereby enhance the production of a diffuse cloud of magnetic particles. The creation of a diffuse cloud, rather than a dense cloud, may be advantageous for high density magnetic materials where the presence of a dense cloud may result in poor transfer to the imaging drum, a diffuse cloud exhibiting better transfer.

A mesh or a perforated metal blade (elongated element having a generally rectangular cross-section) may be used as a deflector blade (670). In either of these, the upstream surface (side) US would be discontinuous, and may cause turbulence in the cloud of magnetic particles passing by (or over) the upstream side US. The use of a mesh or mesh-like structure for the blade surface can agitate the flow of particles thereby assisting the formation of a low density cloud, as discussed previously the formation of a low density highly disperse cloud of magnetic particles may be advantageous for coating on the magnetic imaging drum. Another alternative may be to have a hollow deflector blade with a perforated surface.

Two or more deflector blades may be used, in lieu of a single deflector blade (670). For example, (i) a primary deflector blade, as discussed above, and (ii) a secondary deflector blade placed at a fixed distance from the transfer roller in advance of (upstream, with respect to the transfer roller) the primary deflector blade (in this case the primary deflector blade being as discussed previously, generating the cloud to coat the magnetic imaging drum). The secondary deflector blade can have a variety of shapes similar to the primary deflector blade and may have a shape (profile, cross-section) which is different than that of the primary deflector blade. For example, the secondary deflector blade may have a substantially rectangular, square or circular cross-section. The function of the secondary blade may be primarily to control the thickness of material on the magnetic conveyor roller. Control of the thickness of the magnetic coating on the magnetic conveyor may be needed to regulate the quantity of magnetic particles being displaced from the magnetic transfer roller and thereby control the density of the cloud of magnetic particles. Control of the density of the cloud of magnetic particles may enable improved uniform coating of the imaging drum.

Metal Foils

An additional feature which may improve the performance of smartcards, particularly smartcards having a metal faceplate, comprises the use of very thin metal foils (less than approximately 30 nm) or metallic films. Metal foils, metallic coatings, segments of metal foil or metal particles may be deposited on or embedded in the card body CB, or in or one or more layers thereof, to beneficially alter the electrical characteristics of the RFID device or smartcard. In the main hereinafter, metal foils may be discussed as exemplary of metal foils, metallic coatings, segments of metal foil or metal particles.

The metal foil may comprise any pure metal such as aluminum or copper or an alloy. The metal foils, metallic coatings, segments of metal foil or metal particles should have a thickness less than the skin depth of the metal or material being used in order to prevent the formation of eddy currents in the metal or metallic structure that will attenuate the RF electromagnetic field. The metal foil, metallic coatings, segments of metal foil or metal particles may act to shift the resonance frequency of the smartcard (i.e. the transponder with optional booster antenna), and can be used to compensate for shifts in the resonant frequency due to the presence of the metal card body. In effect, the presence of thin metal foils (or other thin metallic component) can enhance the communication performance of a metal smart card. In addition, the use of for example metal foils can add an aesthetic benefit to a metal smartcard.

Electric current flows mainly at the "skin" of a conductor, between the outer surface and a level called the skin depth. Below the skin depth, current density falls off dramatically. The skin depth for copper, at 13.56 MHz, may be approximately 17.8 µm. A metal layer for an RFID device, such as disclosed herein may comprise nickel 3 µm, a flash of gold 0.3 µm, and copper approximately 12 µm or less, such as 9 µm. The overall thickness of the metal layer may be less than or equal to 18 µm, such as less than 15 µm, or less than 12 µm.

In a conventional smartcard, a shielding layer is required (ferrite, iron alloy, as discussed previously) between the metal card body and the material used to construct the back face of the smartcard (such as PVC or polycarbonate (PC)). Using a metal foil finish on the back of the smartcard can add a visual effect that compliments the metal body of the smartcard. Reference is made to U.S. Pat. No. 8,393,547 (Perfect Plastic).

A holographic metal foil or foils (from e.g. www.cfcintl.com) may be glued or laminated to one side or both sides of a booster antenna BA inlay in a dual interface smartcard. The holographic metal foil(s) may not significantly attenuate the electromagnetic field, in other words the holographic metal foil(s) may be largely transparent to the RF field. The holographic metal foil(s) can be used to mask (visually hide) the presence of the booster antenna BA. In addition, the holographic metal foil(s) when placed on either side (above, below) of the booster antenna BA can generate capacitance which may help improve the communication performance of the smartcard with the reader.

The use of metal foils in RFID devices and smartcards can create problems with electrostatic discharge (ESD). The metal foil may be selectively placed in the smartcard leaving a space around the chip module and/or card perimeter that is filled with insulating material in order to prevent ESD. In addition, the metal foil may be discontinuous, composed of islands of metal separated by insulating tracks to form a honeycomb structure. The insulating tracks may be air gaps around the metal foil islands or tracks of a dielectric material. The islands of metal foil may hexagonal, circular, rectangular or other shape. The insulating tracks may be very thin so as to minimize visibility to the naked eye (e.g. less than 100 µm) and hence preserve the aesthetic appearance of the metal foil layer.

FIG. 8 shows a smart card 800 having a metal card body (or "face plate") 810. The face plate is milled, partially through its thickness, to accept the epoxy glass module tape 820 having contact pads (CP) 822 and connection bridges (CBR) 824 on its top (as viewed) surface (or "contact side"). Magnetic shielding 830 is shown between the face plate and the booster inlay (or card body (CB)) 802. A booster antenna (BA) 804 formed in the synthetic material card body CB, and has a portion (coupler coil CC component) disposed substantially directly below the module antenna (MA) 826 of the antenna module AM. (The antenna module AM may comprise a module tape (MT), contact pads (CP), connection bridges (CBR), chip (CM), encapsulation (MM), and a module antenna (MA).)

A layer of magnetic shielding material 840, some examples of which have been described herein (see, e.g., FIG. 2B, layer 240) may be incorporated between the booster inlay (synthetic card body CB) 802 and the metal face plate, to offset attenuation of RF signals and improve coupling with an external reader (not shown, see FIG. 1).

FIG. 8A shows a smart card 800A, having many of the elements shown in FIG. 8 (the descriptions of which are incorporated herein), with the addition of at least one metal foil 850 to further offset attenuation and improve coupling. One metal foil 850 is shown below the booster inlay (synthetic card body CB). One metal foil 850 is shown above the booster inlay (synthetic card body CB), below the magnetic shielding layer. A magnetic shielding layer 840 may or may not be incorporated along with metal foil(s) 850.

Metal foils may be used in dual interface smartcards (RFID devices), and may comprise metal foil, metallic coatings, segments of a metal foil or metal particles, and constitute an "active" component of the RFID device. The metal foil influences the communication performance of the device and changes the characteristics of the device. These changes can be beneficial. The metal foil (coating, etc.) may be manipulated and tailored improve the performance of the device, such as by beneficially changing the resonances and Q-factor of the booster antenna BA.

Metal foils, metallic coatings, segments of a metal foil or metal particles may be deposited on or embedded in the inlay (or card body CB) to alter the electrical characteristics of the RFID device or smartcard. A metal foil layer in the card body construction may help to meet the ISO and EMV communication standards for RFID devices or smartcards in terms of read write distance, baud rate, Q-factor bandwidth, etc. The metal foil can be any pure metal such as aluminum or copper or an alloy. The metal foils, metallic coatings, segments of a metal foil or metal particles should have a thickness less than the skin depth of the metal or material being used in order to prevent the formation of eddy currents in the metal or metallic structure that will attenuate the RF electromagnetic field. The use of thicknesses substantially less than the skin depth of the metal or material being used will increase the electrical resistance of the structure to alternating current flows (impedance) thereby preventing unwanted or excessive attenuation of the RF electromagnetic field. Other electrical conductors such as metal nanoparticles, metal nanowires or carbon-based conductors like graphite or exfoliated graphite can be used to construct electrically conductive networks that are hereby included under the definition of a metal foil or metallic structure.

The metal foils may comprise a conductive material (such as aluminum on PVC), having a sheet resistance which is very low, on the order of only a few Ohms, which normally should block the electromagnetic field (such as between the booster antenna BA and an external reader, or between the booster antenna BA and the antenna module AM), but a mitigating factor may be the thickness of the aluminum (or other material), being thin enough to allow the electromagnetic field to pass through. The metal foil or metallic structure can advantageously alter (such as lower) the quality factor (Q) of the booster antenna (BA). The metal foil or metallic structure can also have a capacitive effect in the circuit. The presence of the metal foil or metallic structure in the card design can alter the electrical power delivered to the IC chip (CM). Some or all of these effects may enhance the performance of the RFID device or smartcard, improving the coupling between the antenna module AM and the coupler coil CC of the booster antenna BA. The communication between the RFID device or smartcard and the reader can thus be improved.

As discussed above, a layer of magnetic material with high magnetic permeability may be disposed between the booster antenna of a dual interface card or RFID transponder and the metal faceplate (FIG. 1B) or metal surface (FIG. 1C), as a "shielding layer", for the purpose of reducing eddy current losses and to decouple the booster antenna or RFID transponder from the metal surface(s). This shielding in the high frequency band may reduce or prevent attenuation of the carrier wave (13.56 MHz) caused by inducing eddy currents on the metal layer of the card body or proximity to a metal such a battery or casing of a mobile telephone. Without such shielding measures, the eddy currents may create a magnetic field reversing the direction of the carrier wave and causing signal loss between the RFID reader and the DIF smartcard or contactless device such as a transponder. The layer of magnetic material may comprise or contain magnetic particles of various shapes (including rods, spheres or flakes). The magnetic particles may comprise soft magnetic (paramagnetic) compounds such as ferrites including manganese-zinc ferrites and nickel zinc ferrites.

Hard magnetic (ferromagnetic) ferrite alloys such as strontium ferrite, barium ferrite and cobalt ferrite are also included under the definition of magnetic particles. In addition, specially formulated non-ferrite magnetic alloys made of Iron (Fe), Silicon (Si), Silicon dioxide (SiO2) and Chromium (Cr) or Aluminum (Al) and other elemental constituents are included in the definition.

The magnetic layer may be formed by attaching the magnetic particles to a substrate (e.g. polycarbonate (PC), polyvinylchloride (PVC)) with adhesive or by embedding the magnetic particles into the substrate by lamination. Alternatively, the magnetic layer can be formed by mixing the magnetic particles with adhesive, epoxy, polymer or other agents forming a slurry, and then dispensing the mixture onto a surface within the card body. The magnetic particles can also be silk screen printed for selective deposition onto one or more layers within the card body. A mixture of magnetic particles in a liquid agent can also be dispensed into channels within any of the layers of the card body construction. The agent can then be dried or cured by heat or light to fix the magnetic particles in place. The magnetic particles can also be mixed into a protective layer (conformal coating) within the card body, on the surface of the card body or within the chip module (e.g. part of the IC encapsulation).

Within the stackup (layers) of materials comprising the card body, a metal foil can be placed on either or both sides of the booster antenna or transponder inlay. A magnetic shielding layer, as discussed above, layer can be placed directly in contact with the metal layer (faceplate), metallised layer or flash of metal which impedes the RF field, or at a separation distance determined by the thickness of the substrate supporting the magnetic layer. The metal foil(s) can have a beneficial effect on the performance of the dual interface smartcards or contactless devices. The metal foil may enhances the performance of the overall system, improves the performance of metal smartcards that contain shielding material.

Magnetic Particles in Channels/Recesses in the Card Body

Metal smartcard bodies require that the region under the module antenna MA and over the coupler coil CC component of the booster antenna BA are not obstructed by metal, as the metal will attenuate the electromagnetic field and thereby prevent the smartcard from functioning.

FIGS. 9 and 9A show a metal card 900 having a milled or etched cavity (recess) 920 in its card body 910. The recess 920 may be filled with adhesive, and magnetic shielding material 930. A metal smartcard may use magnetic shielding material deposited into one or more channels milled or etched into the metal body of the smartcard. The channel may occupy the majority of the area of the metal body as depicted in FIGS. 9 and 9A.

FIG. 9B shows a smartcard 900B wherein, rather than one large recess (920) a plurality of individual channels or recesses 920a, 920b, 920c, 920d, 920e (which may collectively be referred to as "920") may be formed and filled with magnetic shielding material 930, in areas corresponding with the positions of one or more of the components of the booster antenna (BA), such as the peripheral card antenna (CA) component and coupler coil (CC) component. (Compare FIG. 2B.)

Magnetic shielding material in sheet form may be cut to match the shape of the channel and fixed to the metal card with adhesive. The magnetic shielding material may be in the form of a sheet of PVC or similar material bearing adhesively attached or embedded spherical, flake-like or rod shaped particles of shielding material. The magnetic shielding material may be a commercially available ferrite sheet materials or products such as Flexield® from TDK corporation (http://www.tdk.co.jp/tebck01/flexield_e/e/index.html) or the FLX Series from Toda Kogyo Corp (http://todaeurope.de/index-.php?en_ferrite-sheet-for-rfid). The depth of the channel may be chosen to be similar to the thickness of the magnetic shielding material. A booster inlay and other layers of the smartcard construction may be laminated or attached with adhesive to the cover the recessed area.

Alternatively, the depth of the recessed area may be substantially greater than the thickness of the magnetic shielding layer and adhesive in order to accommodate a booster inlay and/or other layers of the smartcard construction within the recessed area. This allows the perimeter of the finished smartcard to remain solid metal in order to increase the robustness and visual appearance of the metal smartcard.

Antennas for Chip Cards

A smart card, chip card, or integrated circuit card (ICC) is any pocket-sized card with embedded integrated circuits. Smart cards are made of plastic, generally polyvinyl chloride, but sometimes polyethylene terephthalate based polyesters, acrylonitrile butadiene styrene or polycarbonate.

Contact smart cards have a contact area of approximately 1 square centimeter (0.16 sq in), comprising several gold-plated contact pads. These pads provide electrical connectivity when inserted into a reader, which is used as a communications medium between the smart card and a host (e.g., a computer, a point of sale terminal) or a mobile telephone. Contactless smart cards, communicate with the external reader through RF induction technology, and require only proximity to an antenna to communicate. Dual-interface cards implement contactless and contact interfaces on a single card with some shared storage and processing.

In the language of this patent application, the combination of an RFID chip (CM) on one side of a carrier substrate (MT) with contact pads (CP) on the other side of the substrate (MT), with the addition of an antenna (MA) disposed on the chip side of the substrate (MT) and connected with the RFID chip (CM) is termed "antenna module" ("AM").

FIG. 10 shows an etched antenna structure MA, such as would typically be disposed on the chip side of the substrate (module tape MT). A typical pattern for an antenna is generally rectangular, in the form of a flat (planar) coil (spiral) having a number (such 12) of turns (conductive tracks). The antenna is typically chemically etched from the metal layer (foil) on the chip side of the substrate. The 7 filled circles and the dashed line circle under the chip CM represent vias (a total of 8) through the substrate tape MT The RFID chip CM measures approximately 2 mm×2 mm, and is typically disposed in the center of the spiral antenna pattern, making that space unavailable for turns of the antenna. Also, as mentioned above, a significant amount of space around the chip CM is unavailable for the etched antenna. The module being shown here has 8 contact pads. The inner dimension of the antenna MA is approximately 9 mm×8 mm. This is the area occupied by the chip CM and interconnects (and 7 of the vias).

Because of the restrictions on the size of the smart card module (e.g. 13×12 mm, or 12×9 mm), the number of turns forming the antenna is limited to the space surrounding the central position of the silicon die which is attached and bonded to the module substrate. This substrate is generally made of epoxy glass with a contact metallization layer on the face-up side and a bonding metallization layer on the face-down side of the module. The chemically etched antenna is usually formed on the face-down side.

A limitation in creating an inductive antenna through chemical etching is the minimum pitch (or spacing) between tracks, which is economically attainable using a lithographic process. The optimal pitch (or spacing) between (adjacent) tracks of an etched antenna on super 35 mm tape is approximately 100 µm. (As used herein, the term "pitch" may refer to the spacing between adjacent conductive tracks, rather than its conventional meaning the center-to-center dimension between track centerlines or the number of tracks per unit length.)

In contrast with an etched antenna, a wire wound antenna may make much better use of the space available. Some examples of wire wound antennas may be found in U.S. Ser. No. 13/756,631 filed 1 Feb. 2013 (US 20130140370 published 6 Jun. 2013).

A 6 pin (pad) dual interface (DI, DIF) module offers many advantages over an 8 pin module. Because of its reduced size in comparison to the 8 pin DIF module, there are cost savings in terms of the amount of gold which is required on the surface of each contact pad (copper, nickel gold), the milling time to produce a cavity in a card body is reduced because of the smaller space required to accommodate and protect the die, and the gold wires (Ø 24-32 µm) for wire bonding are no longer possible. Because of its smaller footprint, there is more space on the card body after insertion of the module for printing of brand logos and the embossing of character lines. Also, by virtue of being smaller than an 8 pin module, a 6 pin module can better survive card body flexing.

However, due to the small footprint (11.8 mm×8.8 mm) of a 6 pin (pad) DIF module, it is virtually impossible to produce a functional etched antenna on the bond side (chip side) of the module. As discussed above the circumference space (area) between the chip and the perimeter of the chip module is insufficient to contain the etched antenna tracks for inductive coupling. Additionally, because of its small footprint, it is not possible to wire bond the silicon die (chip CM) to the chip module (carrier tape MT) as the spacing between the silicon die and perimeter is insufficient to perform a ball and wedge bond.

As disclosed in US 20130140370, rather than wire-bonding the chip CM to the vias, the chip CM may be flip-chip (ball) bonded to selected traces in the bottom metal layer MB which are associated with those vias. Underfiller may be provided under (on top, as viewed) of the chip CM to support it on and secure it to the module tape MT. Although flip-chip bonding may free up some space for the module antenna MA, wire wound antennas may make better use of the available space than etched antennas.

FIG. 10A shows an example of a chip module CM (or antenna module AM) 1000 comprising a substrate (or module tape MT) 1010, contact pads (CP) 1012 on a "contact side" of the substrate 1010, an RFID chip (CM) 1014 on an opposite "chip side" (or bond side) of the substrate 1010, and an exemplary wire-wound antenna 1016 on the chip side thereof. As a general proposition, the more antenna that can be formed in the available space of the chip module, the better the performance of the chip module may be, thereby easing demands on the booster antenna to effect acceptable communication between the chip card and an external reader.

An etched antenna 1020 may be formed on the contact side of the module tape (MT) 1010 underneath the contact pads (CP) 1012. An exemplary 4 turns of the etched antenna 1020 are shown. The etched antenna 1020 may be covered by a dielectric layer 1022, for example an adhesive layer, alternatively a polymer, for example PET. Alternatively, the etched antenna may comprise (or be formed from) a layer of polyimide or FR4 glass epoxy clad with copper (the copper being used to construct the contact pads). Openings through the module tape and connection bridges may enable connecting the chip with the etched antenna.

The use of the techniques disclosed herein may permit the production of larger antenna structures or multiple antenna structures in the area surrounding the chip on the bonding side (chip side) of the antenna module than would be otherwise possible with a normal sized module. In addition, the use of connection bridges (CBR) may facilitate the connection of these antenna structures to the RFID chip.

Connection Bridges

FIG. 11 illustrates the concept of providing a connection bridge CBR, generally. Metallization on one side (front; top, as viewed) of the module tape MT may be patterned to have contact pads CP (one shown) and a connection bridge CBR (one shown). For purposes of this discussion, the module tape MT may be single-sided tape having metallization on only one side thereof, as illustrated. The concepts presented herein may also be applicable to double-sided tapes having metallization on both sides thereof.

An RFID chip CM component is provided on the other (back; bottom as viewed) side of the module tape MT. A module antenna MA component is also provided on the other side of the module tape MT (on the same side as the RFID chip CM).

The module antenna MA in this example is a wire-wound antenna comprising a wire having two ends a and b, which may be wound on a dam structure (DS; or winding core WC). Generally, the two ends of the module antenna MA need to be connected with corresponding two terminals LA and LB of the RFID chip.

The dam structure DS may be located on the opposite side of the module tape MT from the connection bridge CBR, and may be aligned under the connection bridge CBR. The dam structure DS (or winding core WC) has an interior portion (to the right, as viewed) and an exterior portion (to the left, as viewed). The module antenna MA is wound on the exterior of the dam structure DS. The RFID chip CM is disposed on the module tape MT in the interior of the dam structure DS.

The connection bridge CBR extends from a first position above the exterior portion of the dam structure DS to a second position above the interior portion of the dam structure DS. A first opening 20 ("h") may be provided through the module tape MT at the first position. A second opening 22 ("h") may be provided through the module tape MT at the second position. A first portion 30 of the connection bridge CBR is disposed over the first opening 20 A second end portion 32 of the connection bridge CBR is disposed over the second opening 22.

A first end a of the module antenna MA may be wire-bonded, through the first opening 20 to the underside of the first portion 30 of the connection bridge CBR, and that a first terminal LA of the RFID chip CM may be wire-bonded, through the second opening 22 to the underside of the second portion 32 of the connection bridge CBR.

The connection bridge CBR provides a conductive path which extends from a position which is exterior to the dam structure DS to a position which is interior to the dam structure DS. This facilitates connecting a component (such as the module antenna MA) which is disposed external to the dam structure DS to a component (such as the RFID chip CM) which is disposed internal to the dam structure DS. The connection bridge CBR serves as an interconnect between an end of the module antenna MA component and a terminal of the RFID chip CM component.

At least one of the contact pads (CP) may be modified to establish at least one connection (including two or more connections) between components on the other, opposite (back) side of the module tape MT, such as the module antenna (MA) component and the RFID chip (CM) component.

This is illustrative of making connections between components which may be disposed on one side (the "chip side") to components on the opposite side ("contact side") of the module tape, such as for connecting the antenna 1020 (FIG. 10A) to the RFID chip (CM).

Functional Gaps Between Contact Pads (CP) or Connection Bridges (CBR)

FIG. 12 shows a typical 6-pad pattern for (array of) ISO 7816 contacts. Various contact pads (C1, C2, C3, C5, C6, C7) are labeled. Typical dimensions (in millimeters) of the contact pad array and a punch out area of the module tape around the contact pad array are noted in the diagram. Connection bridges (not shown) may also be provided, surrounding the contact pad array.

Magnetic particles (shown as black dots) coated with functional materials may be placed in and around the contact pads (CP) of a dual interface smart card or other metalized (metallized) structure. The coated magnetic particles can be deposited in the spaces (gaps) between the contact pads on the front side of an antenna module (AM) or in patterns previously formed by chemical or laser etching. A curing process can fix the coated particles in place leaving a non-conductive colored filler.

There may be (typically narrow) gaps between adjacent contact pads (CP) and/or between contact pads and adjacent connection bridges (CBR). These gaps may measure approximately 150-300 µm across (between adjacent pads and/or connection bridges). Active electronic circuitry or functional materials may be disposed in these gaps. For example, electroluminescent material could be mixed with an electrically conductive binding adhesive or polymer and deposited in a gap between two adjacent connection bridges. The electroluminescent material may glow when the smartcard is placed in the presence of an electromagnetic field (such as that produced by an external RFID reader) or may glow when data is communicated between the smartcard and the reader.

The gap between connection bridges can also be used to generate capacitance. The design of the connection bridges can be changed to increase a capacitive effect, for example by forming two connection bridges from inter-digitated lines that intersect such that the gap between adjacent digits is approximately 50 µm or less.

Security features such as photo luminescent dye or phosphorescent materials can be deposited in the gaps between or around contact pads (as shown), and gaps between contact pads and connection bridges (if any).

Conductive Tracks

FIG. 13 illustrates that a passive circuit or an RFID antenna (such as for a booster antenna BA or for a module antenna MA) may be formed on a substrate 1302, such as (but not limited to) a synthetic paper substrate, a temperature-sensitive substrate or a transparent temperature sensitive substrate by spraying, inkjet printing or aerosol jet printing nanowires, such silver or cupronickel nanowires (typically 50 nm in diameter and 50 µm in length), to form a conductive network, and then using a suitable laser to pattern the network in creating an inductive and or capacitive circuit, such as by ablating the nanowire material to create gaps 1304 between conductive tracks 1306.

Nanowire Tracks

FIGS. 14A, 14B, 14C show a technique for forming conductive nanowire networks. FIG. 14A shows a binder 1404 may first be deposited or printed on a substrate 1402 in a pattern which will become the gaps between the inductive tracks or capacitive elements (e.g. electrodes in a grid). FIG. 14B shows a nanowire network (layer) 1406 applied to the substrate. FIG. 14C shows that after the nanowire network is applied to the substrate, the laser may be used to cut the nanowire network to produce a minimal insulation gaps (at binder 1404) between conductive tracks 1408. The binder has a twofold function (i) to protect the underlying temperature sensitive substrate and (ii) to prevent the re-deposition of the laser ablated metal in the gap area. The binder for the gaps may be applied before (below) and after (above) depositing nanowires.

The binder can also be applied to the top surface after the nanowires have been applied to the substrate. Landing pads (not shown) for interconnection with a chip module or die can be applied to the laser patterned nanowire network through gold sputtering, inkjet printing of conductive ink or any suitable method. After mounting of the chip interposer, chip module or die and performing an electrical interconnection, the antenna substrate can be laminated with other layers to form an electronic laminate (such as the electronic laminate shown in FIG. 2A).

The nanowires may be obtained (for example) from Seashell Technology, LLC (La Jolla, Calif.). The nanowires may be silver. The nanowires may have average diameters of 25-200 nm (such as 50 nm) and lengths from 2-100 μm. The length of the nanowires may be reduced through ultrasonic treatment. The nanowires may be sprayed onto the underlying substrate, like jackstraws, overlapping one another. The resulting layer of nanowires may be substantially transparent and highly conductive. The underlying substrate may be PVC, PET, or ITO (indium titanium oxide), or other material, and may be transparent and/or flexible. Bank notes may incorporate the silver nanowires (ultrahigh frequency antennas) as disclosed herein, which may be used to provide anti-forgery protection.

The binder material may have a thickness of 20-50 μm, in the pattern of the gaps between conductive tracks. The binder may be deposited on each side of (above and below) the gap(s) to hold the nanowires down. Then, the nanowires crossing the open space, i.e. gap, can be ablated, and Teslin™ removed. Teslin™ can be ablated directly.

An antenna for an RFID device may be formed of silver nanowires or copper/nickel nanowires, creating a network through aerosol printing or spraying. Glue may be dispensed to form a track or inductive pattern, followed by laser ablating the pattern to create the passive circuit. As mentioned in Ser. No. 13/744,686 filed Jan. 18, 2013 (US 20130126622, May 23, 2013), laser etching (a form of laser ablating) may be used instead of chemical etching to remove material such as metal from layers such as for forming an RFID antenna.

While the invention(s) has/have been described with respect to a limited number of embodiments, these should not be construed as limitations on the scope of the invention(s), but rather as examples of some of the embodiments. Those skilled in the art may envision other possible variations, modifications, and implementations that are also within the scope of the invention(s), based on the disclosure(s) set forth herein.

What is claimed is:

1. An RFID device comprising an RFID chip, a module antenna connected with the RFID chip, and a booster antenna disposed in a layer of the device;
   further comprising:
   one or more shielding layers comprising a layer of synthetic material selectively coated with magnetic material to create an electronic laminate for the RFID device;
   wherein the one or more shielding layers comprise areas of magnetic material selectively disposed in a pattern corresponding to and covering at least a portion of one of more components of the booster antenna; and
   wherein the one or more shielding layers are formed to cover only booster antenna components, rather than an entire surface of the inlay substrate.

2. The RFID device of claim 1, wherein:
   the metal surface is one of a faceplate for a metal smartcard or a metal element of another electronic device.

3. The RFID device of claim 1, wherein the magnetic material comprises:
   a first portion of relatively large particles; and
   a second portion of relatively small particles at least partially filling voids between the relatively large particles.

4. The RFID device of claim 3, wherein:
   the relatively large particles have a size of approximately 100 μm+/−50 μm; and
   the relatively small particles have a size of approximately 30 μm+/−20 μm.

5. The RFID device of claim 1, wherein the magnetic material comprises:
   magnetic particles acting as a carrier for functional materials selected from the group consisting of pigments, amorphous crystalline powders, nanoparticles, tungsten particles, copper particles, iron particles, copper oxide particles.

6. The RFID device of claim 5, wherein:
   the magnetic particles, together with resin and carrier particles, form a conglomerate of material comprising a plurality of magnetic carrier particles and metal or nanoparticles embedded in a resin that can be moved and placed by selective placement on a magnetized drum and electrostatic transfer to a substrate.

7. An RFID device comprising:
   a booster antenna (BA) disposed in an inlay substrate; and
   a metal foil disposed on at least one side of the inlay substrate, the metal foil having a thickness less than a skin depth of the metal of the foil in order to prevent the formation of eddy currents in the metal foil that will attenuate the RF electromagnetic field.

8. The RFID device of claim 7, further comprising:
   a metal faceplate disposed above one side of the inlay substrate.

9. The RFID device of claim 8, further comprising:
   magnetic shielding material disposed between the metal faceplate and the inlay substrate.

10. The RFID device of claim 7, wherein:
    the metal foil comprises nickel, gold and copper.

11. The RFID device of claim 7, wherein:
    an overall thickness of the metal layer is be less than or equal to 18 μm.

* * * * *